(12) United States Patent
Stevens et al.

(10) Patent No.: US 12,215,416 B2
(45) Date of Patent: *Feb. 4, 2025

(54) METHODS FOR DEPOSITING A MOLYBDENUM NITRIDE FILM ON A SURFACE OF A SUBSTRATE BY A CYCLICAL DEPOSITION PROCESS AND RELATED SEMICONDUCTOR DEVICE STRUCTURES INCLUDING A MOLYBDENUM NITRIDE FILM

(71) Applicant: ASM IP Holding B.V., Almere (NL)

(72) Inventors: Eric Christopher Stevens, Tempe, AZ (US); Bhushan Zope, Phoenix, AZ (US); Shankar Swaminathan, Phoenix, AZ (US); Charles Dezelah, Helsinki (FI); Qi Xie, Wilsele (BE); Giuseppe Alessio Verni, Ottignies (BE)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/387,914

(22) Filed: Nov. 8, 2023

(65) Prior Publication Data

US 2024/0068092 A1    Feb. 29, 2024

Related U.S. Application Data

(63) Continuation of application No. 17/688,258, filed on Mar. 7, 2022, now Pat. No. 11,827,978, which is a
(Continued)

(51) Int. Cl.
*C23C 16/34* (2006.01)
*C23C 16/02* (2006.01)
(Continued)

(52) U.S. Cl.
CPC .......... *C23C 16/34* (2013.01); *C23C 16/0272* (2013.01); *C23C 16/08* (2013.01);
(Continued)

(58) Field of Classification Search
CPC ..... C23C 16/34; C23C 16/0272; C23C 16/08; C23C 16/45527; C23C 16/45553;
(Continued)

(56) References Cited

U.S. PATENT DOCUMENTS 5,681,761 A   10/1997  Kim
5,935,648 A   8/1999   Roberson et al.
(Continued)

FOREIGN PATENT DOCUMENTS

JP   2020029618 A   2/2020
KR   20210024418 A   3/2021
(Continued)

OTHER PUBLICATIONS

Petra Alen, "Atomic layer deposition of molybdenum nitride thin films for cu metallizations", Journal of The Electrochemical Society, 152 (5) G361-G366 (2005) (Year:2005).

*Primary Examiner* — Tong-Ho Kim
(74) *Attorney, Agent, or Firm* — Snell & Wilmer L.L.P.

(57) ABSTRACT

Methods for depositing a molybdenum nitride film on a surface of a substrate are disclosed. The methods may include: providing a substrate into a reaction chamber; and depositing a molybdenum nitride film directly on the surface of the substrate by performing one or more unit deposition cycles of cyclical deposition process, wherein a unit deposition cycle may include, contacting the substrate with a first vapor phase reactant comprising a molybdenum halide precursor, and contacting the substrate with a second vapor
(Continued)

phase reactant comprising a nitrogen precursor. Semiconductor device structures including a molybdenum nitride film are also disclosed.

20 Claims, 13 Drawing Sheets

Related U.S. Application Data continuation of application No. 16/992,806, filed on Aug. 13, 2020, now Pat. No. 11,286,558.

(60) Provisional application No. 62/891,254, filed on Aug. 23, 2019, provisional application No. 62/891,247, filed on Aug. 23, 2019.

(51) Int. Cl.
*C23C 16/08* (2006.01)
*C23C 16/455* (2006.01)
*G11C 5/06* (2006.01)
*H01L 21/28* (2006.01)
*H01L 29/06* (2006.01)
*H01L 29/423* (2006.01)
*H01L 29/49* (2006.01)
*H01L 29/78* (2006.01)
*H01L 29/786* (2006.01)
*H10B 12/00* (2023.01)

(52) U.S. Cl.
CPC .. *C23C 16/45527* (2013.01); *C23C 16/45553* (2013.01); *G11C 5/063* (2013.01); *H01L 21/28088* (2013.01); *H01L 29/0673* (2013.01); *H01L 29/42392* (2013.01); *H01L 29/4908* (2013.01); *H01L 29/4966* (2013.01); *H01L 29/7851* (2013.01); *H01L 29/78696* (2013.01); *H10B 12/053* (2023.02); *H10B 12/34* (2023.02); *H10B 12/488* (2023.02)

(58) Field of Classification Search
CPC ........ C23C 16/45523; C23C 16/45525; G11C 5/063; H01L 21/28088; H01L 29/0673; H01L 29/42392; H01L 29/4908; H01L 29/4966; H01L 29/7851; H01L 29/78696; H01L 29/66795; H01L 21/76843; H10B 12/053; H10B 12/34; H10B 12/488
USPC .......................................................... 257/347
See application file for complete search history.

(56) References Cited

U.S. PATENT DOCUMENTS

| | | |
|---|---|---|
| 6,114,242 A | 9/2000 | Sun et al. |
| 6,359,160 B1 | 3/2002 | Sun et al. |
| 9,349,637 B2 | 5/2016 | Na et al. |
| 9,842,835 B1 | 12/2017 | Cheng et al. |
| 10,450,647 B2 | 10/2019 | Sykora et al. |
| 10,714,579 B2 | 7/2020 | Lee et al. |
| 10,734,497 B2 | 8/2020 | Zhu et al. |
| 11,286,558 B2 * | 3/2022 | Stevens ............ C23C 16/45525 |
| 11,295,980 B2 | 4/2022 | Zope et al. |
| 11,521,851 B2 | 12/2022 | Shero et al. |
| 11,581,220 B2 | 2/2023 | Zope et al. |
| 2007/0026654 A1 | 2/2007 | Huotari et al. |
| 2011/0031562 A1 | 2/2011 | Lin et al. |
| 2018/0053660 A1 | 2/2018 | Jandl et al. |
| 2018/0135164 A1 | 5/2018 | Karner et al. |
| 2018/0294187 A1 | 10/2018 | Thombare et al. |
| 2019/0027573 A1 | 1/2019 | Zhu et al. |
| 2019/0067003 A1 | 2/2019 | Zope et al. |
| 2019/0067014 A1 | 2/2019 | Shrestha et al. |
| 2019/0067094 A1 | 2/2019 | Zope et al. |
| 2021/0180184 A1 | 6/2021 | Alessio Verni et al. |
| 2021/0327715 A1 | 10/2021 | Xie et al. |

FOREIGN PATENT DOCUMENTS

| | | |
|---|---|---|
| WO | 2010114386 A1 | 10/2010 |
| WO | 2022005907 A1 | 1/2022 |

* cited by examiner

METHODS FOR DEPOSITING A MOLYBDENUM NITRIDE FILM ON A SURFACE OF A SUBSTRATE BY A CYCLICAL DEPOSITION PROCESS AND RELATED SEMICONDUCTOR DEVICE STRUCTURES INCLUDING A MOLYBDENUM NITRIDE FILM

CROSS-REFERENCE TO RELATED APPLICATION

This Application is a continuation of, and claims priority to and the benefit of, U.S. patent application Ser. No. 17/688,258, filed Mar. 7, 2022 and entitled "METHODS FOR DEPOSITING A MOLYBDENUM NITRIDE FILM ON A SURFACE OF A SUBSTRATE BY A CYCLICAL DEPOSITION PROCESS AND RELATED SEMICONDUCTOR DEVICE STRUCTURES INCLUDING A MOLYBDENUM NITRIDE FILM," which is a continuation of, and claims priority to and the benefit of, U.S. patent application Ser. No. 16/992,806, filed Aug. 13, 2020 and entitled "METHODS FOR DEPOSITING A MOLYBDENUM NITRIDE FILM ON A SURFACE OF A SUBSTRATE BY A CYCLICAL DEPOSITION PROCESS AND RELATED SEMICONDUCTOR DEVICE STRUCTURES INCLUDING A MOLYBDENUM NITRIDE FILM," now U.S. Pat. No. 11,286,558 issued on Mar. 29, 2022, which is a nonprovisional of, and claims priority to and the benefit of, U.S. Provisional Patent Application No. 62/891,254, filed on Aug. 23, 2019 and entitled "METHODS FOR DEPOSITING A MOLYBDENUM NITRIDE FILM ON A SURFACE OF A SUBSTRATE BY A CYCLICAL DEPOSITION PROCESS AND RELATED SEMICONDUCTOR DEVICE STRUCTURES INCLUDING A MOLYBDENUM NITRIDE FILM," and U.S. Provisional Patent Application No. 62/891,247, filed on Aug. 23, 2019 and entitled "METHODS FOR FORMING A POLYCRYSTALLINE MOLYBDENUM FILM OVER A SURFACE OF A SUBSTRATE AND RELATED STRUCTURES INCLUDING A POLYCRYSTALLINE MOLYBDENUM FILM," all of which are hereby incorporated by reference herein.

FIELD OF INVENTION

The present disclosure relates generally to methods for depositing a molybdenum nitride film on a surface of a substrate and particular methods for depositing a molybdenum nitride film by a cyclical deposition process. The present disclosure also generally relates to semiconductor device structures including a molybdenum nitride film.

BACKGROUND OF THE DISCLOSURE

Complementary metal-oxide-semiconductor (CMOS) technologies have conventionally utilized n-type and p-type polysilicon as the gate electrode material. However, doped polysilicon may not be an ideal gate electrode material for advanced technology nodes. For example, although doped polysilicon is conductive, there may still be a surface region which can be depleted of carriers under bias. This depleted region may appear as an extra gate insulator thickness, commonly referred to as gate depletion, and may contribute to the equivalent oxide thickness. While the gate depletion region may be thin, on the order of a few Angstroms (Å), it may become significant as the gate oxide thicknesses are reduced in advance technology nodes. In addition, polysilicon does not exhibit an ideal effective work function (eWF) for both NMOS and PMOS devices. To overcome the non-ideal effective work function of doped polysilicon, a threshold voltage adjustment implantation may be utilized. However, as device geometries reduce in advanced technology nodes, the threshold voltage adjustment implantation processes may become increasingly complex.

To overcome the problems associated with doped polysilicon gate electrodes, the non-ideal doped polysilicon gate material may be replaced with alternative materials, such as, for example, metals, metal nitrides, and metal carbides. For example, the properties of a metal nitride film may be utilized to provide a more ideal effective work function for both NMOS and PMOS devices, wherein the effective work function of the gate electrode, i.e., the energy need to extract an electron, may be compatible with the barrier height of the semiconductor material. For example, in the case of PMOS devices the effective work function is approximately 5.0-5.2 eV, and in the case of the NMOS devices, the effective work function is approximately 4.1-4.3 eV.

Accordingly, methods are desired for forming a low electrical resistivity gate electrode for both NMOS devices and PMOS devices with preferred effective work functions.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods for depositing a molybdenum nitride film on a surface of a substrate by a cyclical deposition process are provided. The methods may comprise: providing a substrate into a reaction chamber; and depositing a molybdenum nitride film directly on the surface of the substrate by performing one or more unit deposition cycles of a cyclical deposition process, wherein a unit deposition cycle comprises: contacting the substrate with a first vapor phase reactant comprising a molybdenum halide precursor; and contacting the substrate with a second vapor phase reactant comprising a nitrogen precursor.

In some embodiments of the disclosure, semiconductor device structures including a molybdenum nitride film are provided. The semiconductor device structures of the disclosure may comprise: a semiconductor channel region; and a gate stack structure disposed directly on the semiconductor channel region, wherein the gate stack structure comprises: a gate dielectric disposed directly on the semiconductor channel region; and a molybdenum nitride film disposed directly on the gate dielectric.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF EXEMPLARY EMBODIMENTS

Figure 1:
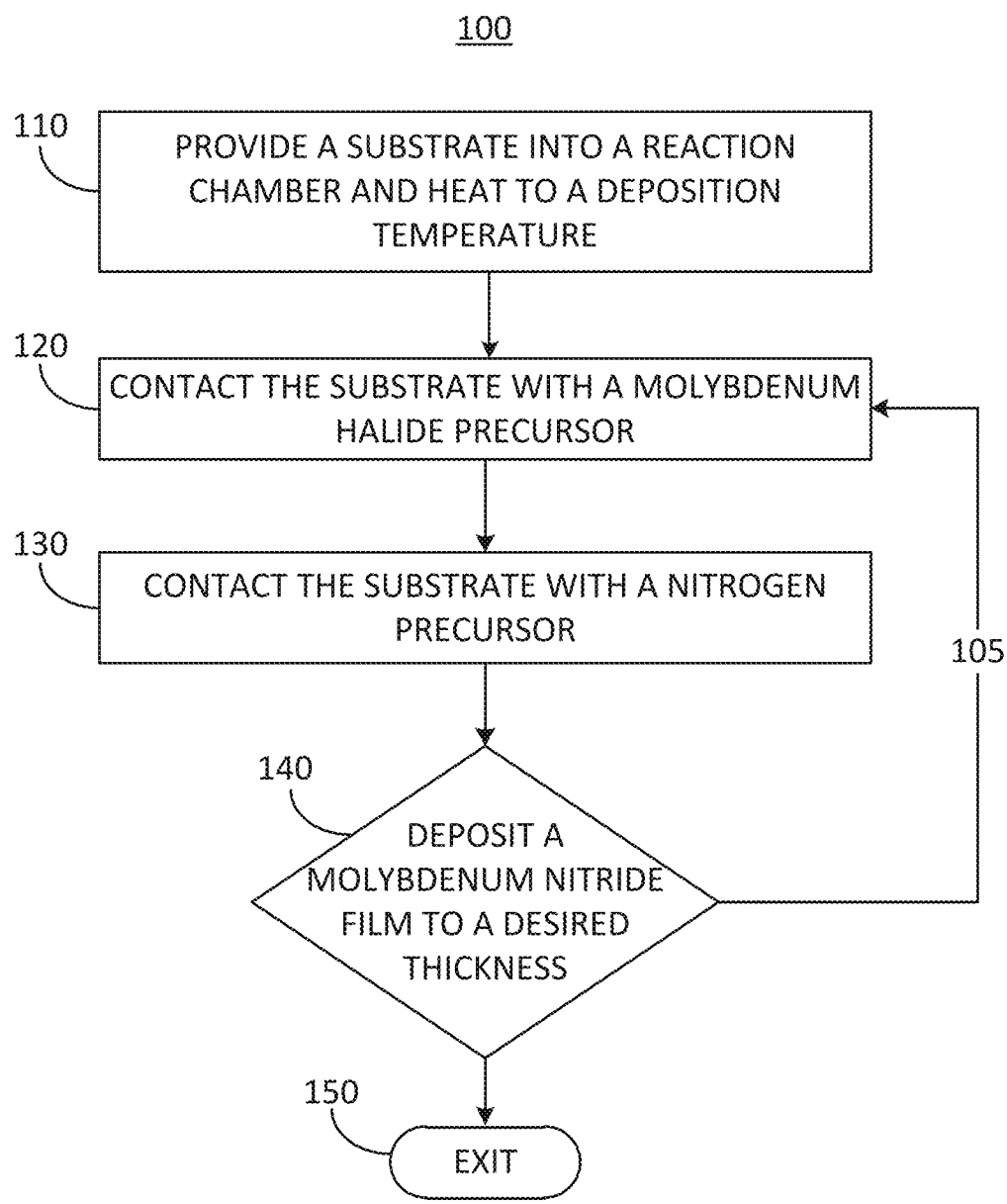
FIG. 1 illustrates an exemplary process flow, demonstrating a cyclical deposition process for depositing a molybdenum nitride film according to the embodiments of the disclosure.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "substrate" may refer to any underlying material or materials that may be used, or upon which, a device, a circuit, or a film may be formed.

As used herein, the term "cyclical deposition" may refer to the sequential introduction of two or more precursors (reactants) into a reaction chamber to deposit a film over a substrate and includes deposition techniques such as atomic layer deposition (ALD) and cyclical chemical vapor deposition (cyclical CVD).

As used herein, the term "cyclical chemical vapor deposition" may refer to any process wherein a substrate is sequentially exposed to two or more volatile precursors, which react and/or decompose on a substrate to deposit a film.

As used herein, the term "atomic layer deposition" (ALD) may refer to a vapor deposition process in which deposition cycles, preferably a plurality of consecutive deposition cycles, are conducted in a reaction chamber. Typically, during each unit deposition cycle a precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the reaction chamber for use in converting the chemisorbed precursor to the desired material on the deposition surface. Typically, this reactant is capable of further reaction with the precursor. Further, purging steps may also be utilized during each unit deposition cycle to remove excess precursor from the reaction chamber and/or remove excess reactant and/or reaction byproducts from the reaction chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, organometallic MBE, and chemical beam epitaxy when performed with alternating pulses of precursor composition(s), reactive gas, and purge (e.g., inert carrier) gas.

As used herein, the term "film" and may refer to any physically continuous or physically discontinuous structures and materials formed by the methods disclosed herein. For example, "film" could include 2D materials, nanolaminates, nanorods, nanotubes, or nanoparticles, or even partial or full molecular layers, or partial or full atomic layers or clusters of atoms and/or molecules. "Film" and may comprise material or a layer with pinholes, but still be at least partially physically continuous.

As used herein, the term "molybdenum nitride film" may refer to a film comprising at least a molybdenum component and a nitrogen component.

As used herein, the term "molybdenum halide precursor" may refer to a reactant which comprises at least a molybdenum component and a halide component, wherein the halide component may include one or more of a chlorine component, an iodine component, or a bromine component.

As used herein, the term "molybdenum chalcogenide halide" may refer to a reactant which comprises at least a molybdenum component, a halide component, and a chalcogen component, wherein a chalcogen is an element from group IV of the periodic table including oxygen (O), sulphur (S), selenium (Se), and tellurium (Te).

As used herein, the term "molybdenum oxyhalide" may refer to a reactant which comprises at least a molybdenum component, an oxygen component, and a halide component.

As used herein, the term "reducing agent" may refer to a reactant that donates an electron to another species in a redox chemical reaction.

As used herein, the term "crystalline film" may refer to a film which displays at least short range ordering or even long range ordering of the crystalline structure and includes single crystalline films as well as polycrystalline films.

As used herein, the term "amorphous film" may refer to a film which displays substantially no ordering of the crystalline structure as would be observed in a crystalline film.

As used herein, the term "gas" may refer to a vapor or vaporized solid and/or vaporized liquid and may be constituted by a single gas or a mixture of gases.

The embodiments of the present disclosure include methods that may be used to deposit a molybdenum nitride film and related semiconductor device structures including a molybdenum nitride film deposited according to the embodiments of the disclosure. In some embodiments of the disclosure, the molybdenum nitride film may form a portion of a gate stack, such as, at least a portion of a gate electrode to a transistor device structure, for example. The molybdenum nitride film based gate electrode may provide a gate stack with a preferred effective work function for both PMOS and NMOS devices.

The existing work function metals employed in the formation of gate electrodes may have limitations due to their unsuitable effective work function values. For example, it is known that the effective work function of a material may vary as a function of its thickness. Therefore, as device geometries decrease in advance technology nodes, the thickness of the corresponding device films, such as the work function metal(s) of the gate electrode, may also decrease in thickness with an associated change in the value of the effective work function of the overall gate stack. Such a change in the effective work function of the gate stack may result in a non-ideal effective work function for both NMOS and PMOS device structures.

In some embodiments of the disclosure, the electrical resistivity of the deposited molybdenum nitride films may be an important parameter in improving semiconductor device efficiency, such as, for example, in applications wherein the molybdenum nitride film may be utilized as a portion of a gate electrode, a liner material (e.g., in memory applications), a barrier layer material, a capping material, or a contact layer. As discussed above, next generation technology nodes may require ever decreasing film thicknesses. However, as the film thickness of a conductive film is decreased the electrical resistivity of the conductive film may increase leading to efficiency losses in the associated semiconductor device structure. As a non-limiting example, the molybdenum nitride films of the current disclosure may be utilized as a replacement for the common titanium nitride films currently employed in semiconductor device structures. Therefore, the molybdenum nitride films of the current disclosure may have a lower electrical resistivity compared with the electrical resistivity commonly achieved in titanium nitride films of comparable thickness.

Therefore, the embodiments of the disclosure may include methods for depositing a molybdenum nitride film on a surface of a substrate by a cyclical deposition process. The methods may comprise: providing a substrate into a reaction chamber; and depositing a molybdenum nitride film directly on the surface of the substrate by performing one or more unit deposition cycles of a cyclical deposition process, wherein a unit deposition cycle comprises: contacting the substrate with a first vapor phase reactant comprising a molybdenum halide precursor; and contacting the substrate with a second vapor phase reactant comprising a nitrogen precursor.

The methods of depositing a molybdenum nitride film directly on a surface of a substrate disclosed herein may comprise a cyclical deposition process, such as, for example, atomic layer deposition (ALD), or cyclical chemical vapor deposition (cyclical CVD).

A non-limiting example embodiment of a cyclical deposition process may include atomic layer deposition (ALD), wherein ALD is based on typically self-limiting reactions, whereby sequential and alternating pulses of reactants are used to deposit about one atomic (or molecular) monolayer of material per unit deposition cycle. The deposition conditions and precursors are typically selected to provide self-saturating reactions, such that an absorbed layer of one reactant leaves a surface termination that is non-reactive with the gas phase reactants of the same reactants. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example, if some gas phase reactions occur despite the alternating nature of the process.

In an exemplary ALD process employed for the deposition of a molybdenum nitride film directly on a surface of a substrate, a unit deposition cycle may comprise: exposing the substrate to a first vapor phase reactant, removing any unreacted first reactant and reaction byproducts from the reaction chamber, and exposing the substrate to a second vapor phase reactant, followed by a second removal step. In some embodiments of the disclosure, the first vapor phase reactant may comprise a molybdenum halide precursor and the second vapor phase reactant may comprise a nitrogen precursor.

Precursors may be separated by inert gases, such as argon (Ar) or nitrogen ($N_2$), to prevent gas-phase reactions between reactants and enable self-saturating surface reactions. In some embodiments, however, the substrate may be moved to separately contact a first vapor phase reactant and a second vapor phase reactant. Because the reactions self-saturate, strict temperature control of the substrates and precise dosage control of the precursors may not be required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

Reactors capable of performing cyclical deposition processes may be utilized to deposit the molybdenum nitride films as described herein. Such reactors include ALD reactors, as well as CVD reactors, configured to provide the precursors. According to some embodiments, a showerhead reactor may be used. According to some embodiments, cross-flow, batch, minibatch, or spatial ALD reactors may be used.

In some embodiments of the disclosure, a batch reactor may be used. In some embodiments, a vertical batch reactor may be used. For example, a vertical batch reactor may comprise, a reaction chamber and an elevator constructed and arranged to move a boat configured for supporting a batch of between 10 to 200 substrates in or out of the reaction chamber. In other embodiments, a batch reactor comprises a minibatch reactor configured to accommodate 10 or fewer wafers, 8 or fewer wafers, 6 or fewer wafers, 4 or fewer wafers, or 2 or fewer wafers. In some embodiments in which a batch reactor is used, wafer-to-wafer non-uniformity is less than 3% (1 sigma), less than 2%, less than 1%, or even less than 0.5%.

The exemplary cyclical deposition processes described herein may optionally be carried out in a reactor and associated reaction chamber(s) connected to a cluster tool. In a cluster tool, because each reaction chamber is dedicated to one type of process, the temperature of the reaction chamber in each module can be kept constant, which improves the throughput compared to a reactor in which the substrate is heated up to the process temperature before each run. Additionally, in a cluster tool it is possible to reduce the time to pump the reaction chamber to the desired process pressure between substrates. In some embodiments of the disclosure, the exemplary cyclical deposition processes for the deposition of a molybdenum nitride film disclosed herein may be performed in a cluster tool comprising multiple reaction chambers, wherein each individual reaction chamber may be utilized to expose the substrate to an individual precursor gas and the substrate may be transferred between different reaction chambers for exposure to multiple precursors, the transfer of the substrate being performed under a controlled ambient to prevent contamination of the substrate. In some embodiments of the disclosure, the cyclical deposition processes described herein may be performed in a cluster tool comprising multiple reaction chambers, wherein each individual reaction chamber may be configured to heat the substrate to a different temperature.

A stand-alone reactor may be equipped with a load-lock. In that case, it is not necessary to cool down the reaction chamber between each run.

According to some non-limiting embodiments of the disclosure, ALD processes may be used to deposit a molybdenum nitride film directly on a surface of a substrate. In some embodiments of the disclosure, each ALD unit deposition cycle may comprise two distinct deposition steps or stages. In a first stage of the unit deposition cycle ("the molybdenum stage"), the substrate surface on which deposition is desired may be contacted with a first vapor phase reactant comprising a molybdenum precursor which chemisorbs on to the surface of the substrate, forming no more than about one monolayer of reactant species on the surface of the substrate. In a second stage of the unit deposition cycle ("the nitrogen stage"), the substrate surface on which deposition is desired may be contacted with a second vapor phase reactant comprising a nitrogen precursor.

An exemplary cyclical deposition process for depositing a molybdenum nitride film directly on a surface of a substrate may be understood with reference to FIG. 1 which illustrates an exemplary atomic layer deposition process 100 for the deposition of a molybdenum nitride film on a surface of a substrate.

In more detail, FIG. 1 illustrates an exemplary molybdenum nitride deposition process 100 including a cyclical deposition phase 105. The exemplary atomic layer deposition process 100 may commence with a process block 110 which comprises, providing a substrate into a reaction chamber and heating the substrate to a desired deposition temperature.

In some embodiments of the disclosure, the substrate may comprise a planar substrate or a patterned substrate including high aspect ratio features, such as, for example, vertical trenches, horizontal trenches, vertical gap features, horizontal gap features, and/or fin structures. The substrate may comprise one or more materials including, but not limited to, semiconductor materials, dielectric materials, and metallic materials. The substrate may also comprise one or more exposed surfaces including, but not limited to, semiconductor surfaces, dielectric surfaces, and metallic surfaces.

In some embodiments, the substrate may include semiconductor materials, such as, but not limited to, silicon (Si), germanium (Ge), germanium tin (GeSn), silicon germanium (SiGe), silicon germanium tin (SiGeSn), silicon carbide (SiC), or a group III-V semiconductor material.

In some embodiments, the substrate may include dielectric materials, such as, but not limited, to silicon containing dielectric materials and metal oxide dielectric materials. In some embodiments, the substrate may comprising one or more silicon-containing dielectric materials/surfaces such as, but not limited to, silicon dioxide ($SiO_2$), silicon suboxides, silicon nitride ($Si_3N_4$), silicon oxynitride (SiON), silicon oxycarbide (SiOC), silicon oxycarbide nitride (SiOCN), silicon carbon nitride (SiCN). In some embodiments, the substrate may one or more metal oxide materials/surfaces such as, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), hafnium silicate ($HfSiO_x$), and lanthanum oxide ($La_2O_3$).

In some embodiments, the substrate may comprise an engineered substrate wherein a surface semiconductor layer is disposed over a bulk support with an intervening buried oxide (BOX) disposed there between.

Patterned substrates may comprise substrates that may include semiconductor device structures formed into or onto a surface of the substrate. For example, semiconductor devices structures may comprise partially fabricated semiconductor device structures, such as, for example, transistors and/or memory elements. In some embodiments, the substrate may contain monocrystalline surfaces and/or one or more secondary surfaces that may comprise a non-monocrystalline surface, such as a polycrystalline surface and/or an amorphous surface.

The reaction chamber utilized for the deposition may be an atomic layer deposition reaction chamber, or a chemical vapor deposition reaction chamber, or any of the reaction chambers as previously described herein.

In some embodiments of process block 110 (FIG. 1), the substrate may be heated to a deposition temperature for the subsequent cyclical deposition phase 105. For example, the substrate may be heated to a substrate temperature of less than approximately 700° C., or less than approximately 600° C., or less than approximately 500° C., or less than approximately 400° C., or less than approximately 300° C., or even less than approximately 200° C. In some embodiments, the substrate temperature during the cyclical deposition process 100 may be between approximately 200° C. and 700° C., or between approximately 350° C. and 600° C., or between approximately 450° C. and 550° C.

In addition to achieving a desired deposition temperature, i.e., a desired substrate temperature, the exemplary cyclical deposition process 100 may also regulate the pressure within the reaction chamber during film deposition. For example, in some embodiments, the exemplary cyclical deposition process 100 may be performed within a reaction chamber regulated to a pressure of less than 300 Torr, or less than 200 Torr, or less than 100 Torr, or less than 50 Torr, or less than 30 Torr, or less than 10 Torr, or less than 5 Torr, or even less than 2 Torr. In some embodiments, the pressure within the reaction chamber during deposition may be regulated at a pressure between approximately 2 Torr and 300 Torr, or between approximately 30 Torr and 80 Torr.

Upon heating the substrate to a desired deposition temperature and regulating the pressure within the reaction chamber, the exemplary cyclical deposition process 100 (e.g., an ALD process) may continue with a cyclical deposition phase 105 by means of a process block 120, which comprises contacting the substrate with a first vapor phase reactant comprising a molybdenum halide precursor, i.e., the molybdenum precursor.

In some embodiments of the disclosure, the molybdenum halide precursor may comprise a molybdenum chloride precursor, a molybdenum bromide precursor, or a molybdenum iodide precursor. For example, as a non-limiting example, the molybdenum chloride may comprise one or more of: molybdenum pentachloride ($MoCl_5$), or molybdenum hexachloride ($MoCl_6$).

In some embodiments, the molybdenum halide precursor may comprise a molybdenum chalcogenide halide precursor, such as, for example, a molybdenum oxyhalide precursor selected from the group comprising: a molybdenum oxychloride, a molybdenum oxyiodide, and/or a molybdenum oxybromide. In some embodiments, the molybdenum precursor may comprise a molybdenum oxychloride comprises one of more of: molybdenum (V) trichloride oxide ($MoOCl_3$), molybdenum (VI) tetrachloride oxide ($MoOCl_4$), or molybdenum (IV) dichloride dioxide ($MoO_2Cl_2$).

In alternative embodiments, the first vapor phase reactant, i.e., the molybdenum precursor, may comprise a metalorganic molybdenum precursor, such as, for example, $Mo(NMe_2)_4$, $Mo(NEt_2)_4$, $Mo_2(NMe_2)_6$, $Mo(tBuN)_2(NMe_2)_2$, $Mo(tBuN)_2(NEt_2)_2$, $Mo(NEtMe)_4$, $Mo(NtBu)_2(StBu)_2$, $Mo(NtBu)_2(iPr_2AMD)_2$ $Mo(thd)_3$, $MoO_2(acac)$, $MoO_2(thd)_2$, and/or $MoO_2(iPr_2AMD)_2$. The first vapor phase reactant may comprise an organometallic molybdenum compound including but not limited to those containing cyclopentadinyl (Cp) ligands, $\eta^6$-arene ligands, and carbonyl ligands, such as, for example, $Mo(CO)_6$, $Mo(Cp)_2H_2$, $Mo(iPrCp)_2H_2$, $Mo(\eta^6\text{-ethylbenzene})_2$, $MoCp(CO)_2(\eta^3\text{-allyl})$, $MoCp(CO)_2(NO)$, $Mo(benzene)_2$, $MoCp_2Cl_2$, and MoCp $(NMe)_3$, as well variants thereof.

In at least one embodiment of the invention, the first vapor phase reactant may comprise bis(tertbutylimido)bis(dimethylamino) molybdenum (VI). The first vapor phase reactant may react with a second vapor phase reactant, where the second vapor phase reactant may comprise ammonia gas. The resulting molybdenum nitride film may have work function values, resistivity, and a flatband shift suitable for a pMOS work function metal application. This may be due in part to molybdenum's higher electronegativity in comparison to titanium or vanadium, for example. In addition, molybdenum nitride's lower resistivity enables a higher effective work function.

In some embodiments of the disclosure, contacting the substrate with a molybdenum halide precursor may comprise a contact time period of between about 0.1 seconds and about 60 seconds, or between about 0.1 seconds and about 10 seconds, or even between about 0.5 seconds and about 5.0 seconds. In addition, during the contacting of the substrate with the molybdenum halide precursor, the flow rate of the molybdenum halide precursor may be less than 1000 sccm, or less than 500 sccm, or less than 100 sccm, or less than 10 sccm, or even less than 1 sccm. In addition, during the contacting of substrate with the molybdenum halide precursor, the flow rate of the molybdenum precursor may range from about 1 to 2000 sccm, from about 5 to 1000 sccm, or from about 10 to about 500 sccm.

The exemplary cyclical deposition process for deposition a molybdenum nitride film as illustrated by process 100 of FIG. 1 may continue by purging the reaction chamber. For example, excess molybdenum halide precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5 seconds, or less than approximately 3 seconds, or less than approximately 2 seconds, between approximately 2 to 5 seconds. Excess molybdenum halide precursor and any possible reaction byproducts may be removed with the aid of a vacuum, generated by a pumping system in fluid communication with the reaction chamber. In some embodiments of the disclosure, a purge cycle following contacting the substrate with the first vapor phase reactant may be omitted.

The exemplary cyclical deposition process 100 may continue with a second stage of the cyclical deposition phase 105 by means of a process block 130 which comprises, contacting the substrate with a second vapor phase reactant, and particularly contacting the substrate with a second vapor phase reactant comprising a nitrogen precursor ("the nitrogen stage").

In some embodiments of the disclosure, the nitrogen precursor may comprise at least one of: molecular nitrogen ($N_2$), ammonia ($NH_3$), hydrazine ($N_2H_4$), a hydrazine derivative, or a nitrogen-based plasma. In some embodiments, the hydrazine derivative may comprise an alkylhydrazine including at least one of: tertbutylhydrazine ($C_4H_9N_2H_3$), methylhydrazine ($CH_3NHNH_2$), 1,1-dimethylhydrazine (($CH_3$)$_2N_2H_2$), 1,2-dimethylhydrazine, ethylhydrazine, 1,1-diethylhydrazine, 1-ethyl-1-methylhydrazine, isopropylhydrazine, phenylhydrazine, 1,1-diphenylhydrazine, 1,2-diphenylhydrazine, N-aminopiperidine, N-aminopyrrole, N-aminopyrrolidine, N-methyl-N-phenylhydrazine, 1-amino-1,2,3,4-tetrahydroquinoline, N-aminopiperazine, 1,1-dibenzylhydrazine, 1,2-dibenzylhydrazine, 1-ethyl-1-phenylhydrazine, 1-aminoazepane, 1-methyl-1-(m-tolyl)hydrazine, 1-ethyl-1-(p-tolyl)hydrazine, 1-aminoimidazole, 1-amino-2,6-dimethylpiperidine, N-aminoaziridine, or azo-tert-butane. In some embodiments, the nitrogen-based plasma may be generated by the application of RF power to a nitrogen containing gas and the nitrogen-based plasma may comprise atomic nitrogen (N), nitrogen ions, nitrogen radicals, and excited species of nitrogen. In some embodiments, the nitrogen based plasma may further comprise additional reactive species, such as, by the addition of a further gas.

In some embodiments of the disclosure, contacting the substrate with the nitrogen precursor may comprise a contact time period of between about 0.01 seconds and about 180 seconds, or between about 0.05 seconds and about 60 seconds, or even between about 0.1 seconds and about 10.0 seconds. In some embodiments, the substrate may be exposed to the nitrogen precursor for a time period of less than 60 seconds, or less than 30 seconds, or less than 15 seconds, or even less than 5 seconds. In some embodiments, the substrate may be exposed to the nitrogen precursor for a time period between 5 seconds and 60 seconds, or between 5 seconds and 30 seconds. In addition, during the contacting of the substrate with the nitrogen precursor, the flow rate of the nitrogen precursor may be less than 30 slm, or less than 15 slm, or less than 10 slm, or less than 5 slm, or less than 2 slm, or even less than 1 slm. In addition, during the contacting of the substrate with the nitrogen precursor, the flow rate of the nitrogen precursor may range from about 0.1 to 30 slm, from about 2 to 15 slm, or equal to or greater than 2 slm.

Upon contacting the substrate with the nitrogen precursor, the exemplary cyclical deposition process 100 may proceed by purging the reaction chamber, as previously described herein. In some embodiments of the disclosure, a purge cycle following contacting the substrate with the nitrogen precursor may be omitted.

The cyclic deposition phase 105 of exemplary cyclical deposition process 100 may continue with a decision gate 140, wherein the decision gate 140 is dependent on the average film thickness of the molybdenum nitride film deposited. For example, if the molybdenum nitride film is deposited at an insufficient average thickness for a desired device application, then the cyclical deposition phase 105 may be repeated by returning to the process block 120 and continuing through a further unit deposition cycle, wherein a unit deposition cycle may comprise contacting the substrate with a molybdenum halide precursor (process block 120), purging the reaction chamber, contacting the substrate with a nitrogen precursor (process block 130), and again purging the reaction chamber. In some embodiments, a unit deposition cycle of cyclical deposition phase 105 may omit purge cycles following the introduction of precursors.

A unit deposition cycle of cyclical deposition phase 105 may be repeated one or more times until a desired average film thickness of a molybdenum nitride film is deposited over the substrate. Once the molybdenum nitride film has been deposited to the desired average film thickness, the exemplary cyclical deposition process 100 may exit via a process block 150, and the substrate with the molybdenum nitride film deposited thereon may be subjected to further processing for the formation of a semiconductor device structure, for example.

It should be appreciated that in some embodiments of the disclosure, the order of contacting of the substrate with the first vapor phase reactant (e.g., the molybdenum precursor) and the second vapor phase reactant (e.g., the nitrogen precursor) may be such that the substrate is first contacted with the second vapor phase reactant followed by the first vapor phase reactant. In addition, in some embodiments, the cyclical deposition phase 105 of exemplary cyclical deposition process 100 may comprise, contacting the substrate with the first vapor phase reactant one or more times prior to contacting the substrate with the second vapor phase reactant one or more times. In addition, in some embodiments, the cyclical deposition phase 105 of exemplary cyclical deposition process 100 may comprise, contacting the substrate with the second vapor phase reactant one or more times prior to contacting the substrate with the first vapor phase reactant one or more times.

In some embodiments, the cyclical deposition processes described herein may comprise a hybrid ALD/CVD or a cyclical CVD process. For example, in some embodiments, the growth rate of an ALD process may be low compared with a CVD process. One approach to increase the growth rate may be that of operating at a higher substrate temperature than that typically employed in an ALD process, resulting in some portion of a chemical vapor deposition process, but still taking advantage of the sequential introduction of precursors, such a process may be referred to as cyclical CVD. In some embodiments, a cyclical CVD process may comprise the introduction of two or more precursors into the reaction chamber wherein there may be a time period of overlap between the two or more precursors in the reaction chamber resulting in both an ALD component of the deposition and a CVD component of the deposition. For example, a cyclical CVD process may comprise the continuous flow of a first precursor into the reaction chamber and the periodic pulsing of a second precursor into the reaction chamber.

In some embodiments, a cyclical deposition process utilized for the deposition of a molybdenum nitride film may comprise a unit deposition which further includes, contacting the substrate with a third vapor phase reactant comprising a reducing agent. As a non-limiting example, in some embodiments, a nitrogen precursor and a reducing agent may be co-flowed into the reaction chamber, i.e., the substrate is contacted with the nitrogen precursor and the reducing agent concurrently. As a further non-limiting example, in some embodiments, the nitrogen precursor and the reducing agent may be introduced into the reaction chamber as separate gas pulses, e.g., a purge cycle may be performed between the processes of contacting the substrate with the nitrogen precursor and contacting the substrate with the reducing agent.

Figure 2:
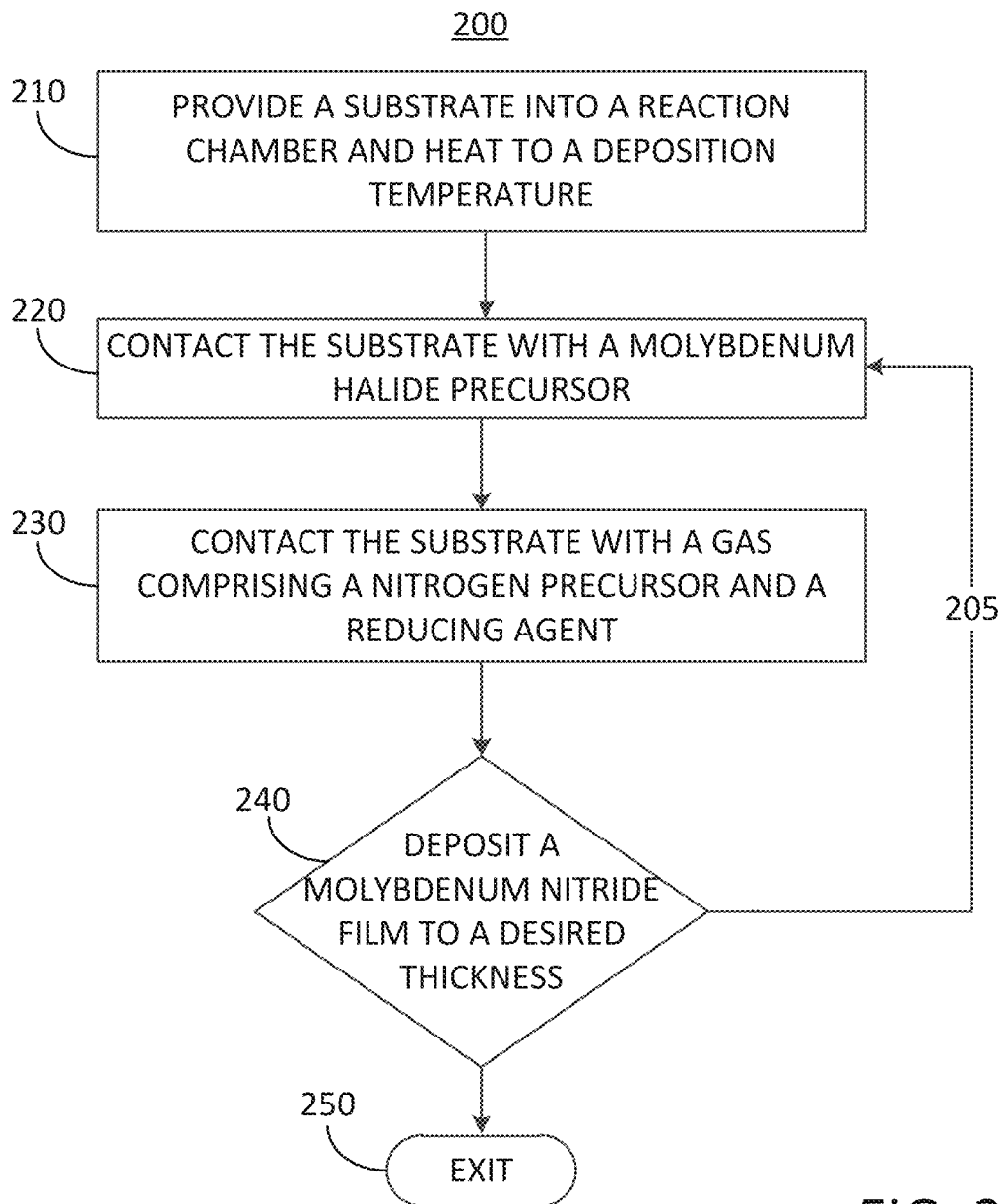
FIG. 2 illustrates an exemplary process flow, demonstrating an additional cyclical deposition process for depositing a molybdenum nitride film according to the embodiments of the disclosure.

In more detail, FIG. 2 illustrates an exemplary cyclical deposition process 200 employed for molybdenum nitride deposition. The exemplary process 200 may include a cyclical deposition phase 205 which comprises a process block 230 wherein the substrate is contacted with a gas comprising a nitrogen precursor and a reducing agent precursor, i.e., the nitrogen precursor and the reducing agent precursor are exposed to the substrate concurrently.

The exemplary cyclical deposition process 200 may commence with a process block 210 which comprises, providing a substrate into a reaction chamber and heating the substrate to a desired deposition temperature. The process block 210 may be substantially the same as the process block 110 of FIG. 1, and therefore, the description of the process block 210 is not repeated in the interest of brevity.

The exemplary cyclical deposition process 200 may continue by a cyclical deposition phase 205 which may commence by means of a process block 220 comprising, contacting the substrate with a molybdenum halide precursor. The process block 220 may be substantially the same as the process block 120 of FIG. 1, and therefore, the description of the process block 220 is not repeated in the interest of brevity.

The exemplary cyclical deposition process 200 (FIG. 2) may continue by purging the reaction chamber as previously discussed in relation to exemplary process 100 of FIG. 1. In some embodiments of the disclosure, a purge cycle following contacting the substrate with the molybdenum halide precursor may be omitted.

The exemplary cyclical deposition process 200 may continue with a second stage of the cyclical deposition phase 205 by means of a process block 230 which comprises, contacting the substrate with a gas comprising a nitrogen precursor and a reducing agent. In other words, the substrate may be contacted with a gas which comprises both a nitrogen precursor and a reducing agent. In at least one embodiment of the invention, a single gas that contacts the substrate may be both a nitrogen precursor and a reducing agent.

In some embodiments, the nitrogen precursor may comprise one or more of the nitrogen precursors previously described in relation to the process block 130 of FIG. 1, and therefore, in the interest of brevity the nitrogen precursor(s) that may employed in exemplary process 200 are not described for a second time.

In some embodiments of the disclosure, the substrate may be contacted with a gas comprising a nitrogen precursor and a reducing agent for a time period of between about 0.01 seconds and about 180 seconds, between about 0.05 seconds and about 60 seconds, or between about 0.1 seconds and about 10.0 seconds, or for a time period of less than 60 seconds, or less than 30 seconds, or less than 15 seconds, or even less than 5 seconds. In some embodiments, the substrate may be exposed to the gas comprising a nitrogen precursor and a reducing agent for a time period between approximately 5 seconds and 60 seconds, or between approximately 5 seconds and 30 seconds. In addition, during the contacting of the substrate with the gas comprising both a nitrogen precursor and a reducing agent, the flow rate of the nitrogen precursor may be less than 30 slm, or less than 15 slm, or less than 10 slm, or less than 5 slm, or less than 2 slm, or less than 1 slm, or even between approximately 1 slm and 30 slm. In addition, the flow rate of the reducing agent may be less than 30 slm, or less than 15 slm, or less than 10 slm, or less than 5 slm, or less than 2 slm, even between approximately 2 slm and 30 slm.

The exemplary cyclical deposition process 200 may proceed by purging the reaction chamber, as previously described herein. In some embodiments of the disclosure, a purge cycle following contacting the substrate with the nitrogen precursor/reducing agent may be omitted.

The cyclic deposition phase 205 of exemplary cyclical deposition process 200 may continue with a decision gate 240, wherein the decision gate 240 is dependent on the average film thickness of the molybdenum nitride film deposited. For example, if the molybdenum nitride film is deposited at an insufficient average film thickness for a particular device application, then the cyclical deposition phase 205 may be repeated by returning to the process block 220 and continuing through a further unit deposition cycle, wherein a unit deposition cycle may comprise, contacting the substrate with a molybdenum halide precursor (process block 220), purging the reaction chamber, contacting the substrate with a gas comprising a nitrogen precursor and a reducing agent (process block 230), and again purging the reaction chamber. In some embodiments, a unit deposition cycle of cyclical deposition phase 205 may omit purge cycles following the introduction of precursors.

A unit deposition cycle of cyclical deposition phase 205 may be repeated one or more times until a desired average film thickness of a molybdenum nitride film is deposited over the substrate. Once the molybdenum nitride film has been deposited to the desired average film thickness the exemplary cyclical deposition process 200 may exit via a process block 250 and the substrate with the molybdenum nitride film deposited thereon, may be subjected to further processing for the formation of a device structure, for example.

It should be appreciated that in some embodiments of the disclosure, the order of contacting of the substrate with the molybdenum halide precursor and the gas comprising a nitrogen precursor and a reducing agent may be such that the substrate is first contacted with the gas comprising a nitrogen precursor and a reducing agent followed by the molybdenum halide precursor. In addition, in some embodiments, the cyclical deposition phase 205 of exemplary process 200 may comprise, contacting the substrate with the molybdenum halide precursor one or more times prior to contacting the substrate with the gas comprising both a nitrogen precursor and a reducing agent. In addition, in some embodiments, the cyclical deposition phase 205 of exemplary process 200 may comprise, contacting the substrate with the gas comprising a nitrogen precursor and a reducing agent one or more times prior to contacting the substrate with the molybdenum halide precursor one or more times.

In some embodiments, an exemplary cyclical deposition processes employed for the deposition of a molybdenum nitride film may comprise separate pulses of a nitrogen precursor and a reducing agent, e.g., a purge cycle may be performed between contacting the substrate with the nitrogen precursor and contacting the substrate with the reducing agent.

Figure 3:
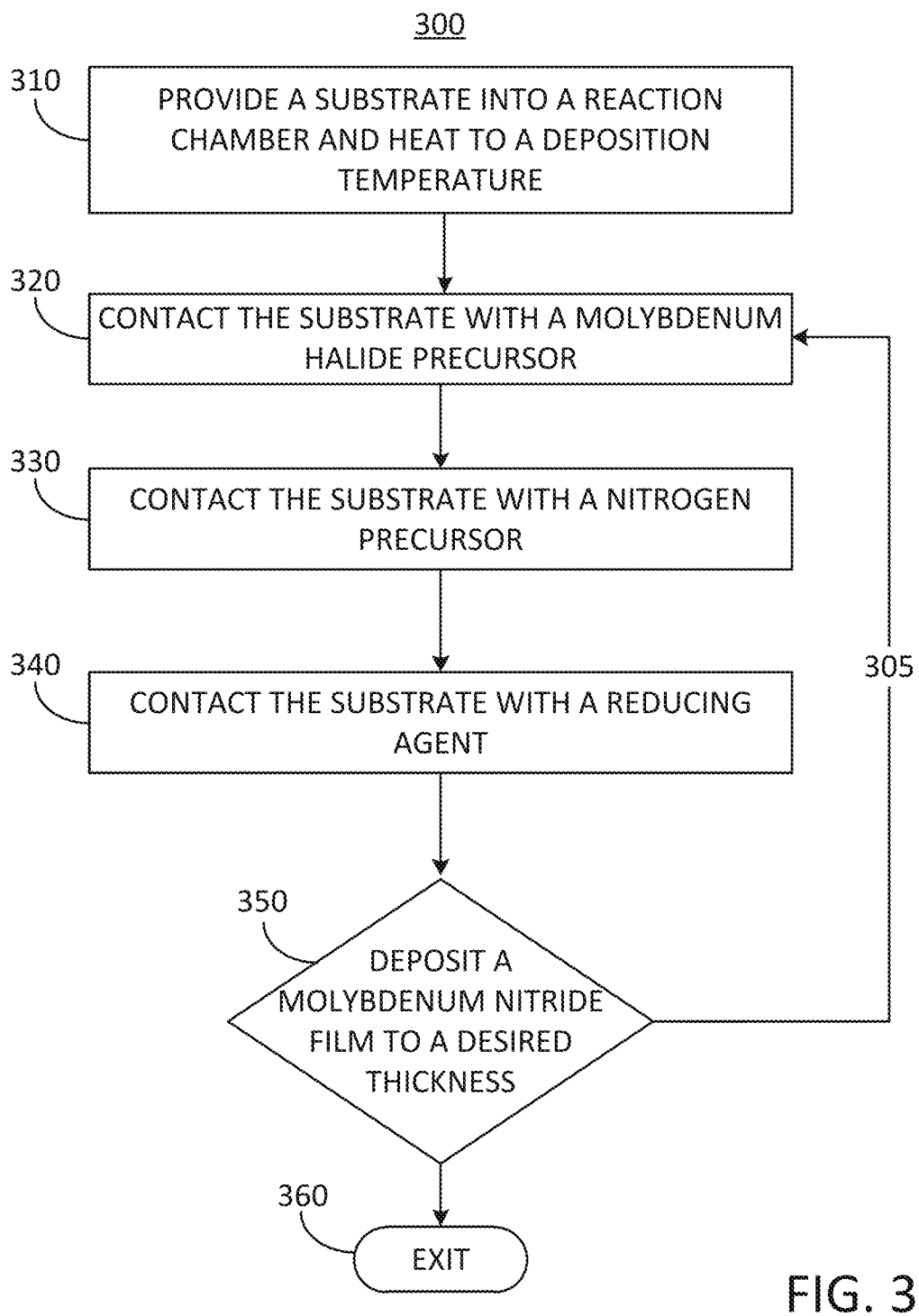
FIG. 3 illustrates an exemplary process flow, demonstrating a further cyclical deposition process for depositing a molybdenum nitride film according to the embodiments of the disclosure.

In more detail, FIG. 3 illustrates an exemplary cyclical deposition process 300 including a cyclical deposition phase 305. In some embodiments, the cyclical deposition phase 305 may comprise a process block 330 for contacting the substrate with a nitrogen precursor, and a process block 340 for contacting the substrate with a reducing agent, i.e., the substrate may be separately exposed to the nitrogen precursor and the reducing agent.

The exemplary cyclical deposition process 300 may commence with a process block 310 which comprises, providing a substrate into a reaction chamber and heating the substrate to a desired deposition temperature. The process block 310 may be substantially the same as the process block 110 of FIG. 1, and therefore, the description of the process block 310 is not repeated in the interest of brevity.

The exemplary cyclical deposition process 300 may continue by a cyclical deposition phase 305 which may commence by means of a process block 320 comprising, contacting the substrate with a molybdenum halide precursor. The process block 320 may be substantially the same as the process block 120 of FIG. 1, and therefore, the description of the process block 220 is not repeated in the interest of brevity.

The exemplary cyclical deposition phase 305 of exemplary cyclical deposition process 300 (FIG. 3) may continue by purging the reaction chamber as previously discussed in relation to exemplary process 100 of FIG. 1. In some embodiments of the disclosure, a purge cycle following contacting the substrate with the molybdenum halide precursor may be omitted The exemplary cyclical deposition process 300 (FIG. 3) may continue with a second stage of the cyclical deposition phase 305 by means of a process block 330 which comprises, contacting the substrate with a nitrogen precursor. The process block 330 may be substantially the same as the process block 130 of FIG. 1, and therefore, the description of the process block 330 is not repeated in the interest of brevity.

The exemplary cyclical phase 300 of process 300 (FIG. 3) may continue by purging the reaction chamber as previously discussed in relation to exemplary process 100 of FIG. 1. In some embodiments of the disclosure, a purge cycle following contacting the substrate with the nitrogen precursor may be omitted The exemplary cyclical deposition process 300 may continue with a third stage of the cyclical deposition phase 305 by means of a process block 340 which comprises, contacting the substrate with a reducing agent. In some embodiments of the disclosure, the reducing agent precursor may be selected from those previously described in relation to the process block 230, and therefore, in the interest of brevity the reducing agent(s) employed in process 220 are not repeated.

In some embodiments of the disclosure, the substrate may be contacted with the reducing agent for a time period of between about 0.01 seconds and about 180 seconds, between about 0.05 seconds and about 60 seconds, or between about 0.1 seconds and about 10.0 seconds, or for a time period of less than 60 seconds, or less than 30 seconds, or less than 15 seconds, or even less than 5 seconds. In some embodiments, the substrate may be exposed to the reducing agent precursor for a time period between 5 seconds and 60 seconds, or between 5 seconds and 30 seconds. In addition, during the contacting of the substrate with the reducing agent, the flow rate of the reducing agent precursor may be less than 100 slm, or less than 50 slm, or less than 25 slm, or less than 10 slm, or less than 5 slm, or even between approximately 5 slm and 100 slm.

The exemplary cyclical deposition process 300 (FIG. 3) may continue by purging the reaction chamber as previously discussed in relation to exemplary process 100 of FIG. 1. In some embodiments of the disclosure, a purge cycle following contacting the substrate with the reducing agent may be omitted.

The cyclic deposition phase 305 of exemplary process 300 (FIG. 3) may continue with a decision gate 350, wherein the decision gate 350 is dependent on the average film thickness of the molybdenum nitride film deposited. For example, if the molybdenum nitride film is deposited at an insufficient average film thickness for a desired device application, then the cyclical deposition phase 305 may be repeated by returning to the process block 320 and continuing through a further unit deposition cycle, wherein a unit deposition cycle may comprise, contacting the substrate with a molybdenum halide precursor (process block 320), purging the reaction chamber, contacting the substrate with a nitrogen precursor (process block 330), purging the reaction chamber, contacting the substrate with a reducing agent (process block 340), and again purging the reaction chamber. In some embodiments, a unit deposition cycle of cyclical deposition phase 305 may omit purge cycles following the introduction of precursors A unit deposition cycle of cyclical deposition phase 305 may be repeated one or more times until a desired average film thickness of a molybdenum nitride film is deposited over the substrate. Once the molybdenum nitride film has been deposited to the desired average film thickness the exemplary cyclical deposition process 300 may exit via a process block 360 and the substrate with the molybdenum nitride film deposited thereon, may be subjected to further processing for the formation of a device structure, for example.

It should be appreciated that in some embodiments of the disclosure, the order of contacting of the substrate with the molybdenum halide precursor, the nitrogen precursor, and the reducing agent may be performed in any conceivable sequence order and is not limited by the sequence order illustrated in FIG. 3. In addition, the contacting of the substrate with a particular precursor, such as, the molybdenum halide precursor, the nitrogen precursor, or the reducing agent, may be repeated one or more times prior to performing a subsequent process block of cyclical deposition phase 305.

The exemplary deposition processes disclosure herein may deposit a molybdenum nitride film directly on surface of a substrate at a growth rate from about 0.05 Å/cycle to about 10 Å/cycle, from about 0.5 Å/cycle to about 5 Å/cycle, or even from about 0.5 Å/cycle to about 2 Å/cycle. In some embodiments the growth rate of the molybdenum nitride film directly on a surface of a substrate is greater than about 0.5 Å/cycle, more than about 1 Å/cycle, or even more than about 2 Å/cycle. In some embodiments of the disclosure, the molybdenum nitride film may be deposited at a growth rate between 0.5 Å/cycle and 1 Å/cycle, or between 0.8 Å/cycle and 1 Å/cycle at a deposition temperature, i.e. substrate temperature, between 300° C. and 700° C., or between 400° C. and 500° C., or even less than 450° C.

The molybdenum nitride films deposited by the methods disclosed herein may be physically continuous films. In some embodiments, the molybdenum nitride film may be physically continuous at an average film thickness below approximately 100 Å, or below approximately 60 Å, or below approximately 50 Å, or below approximately 40 Å, or below approximately 30 Å, or approximately 20 Å, even between approximately 20 Å and 100 Å.

In some embodiments, the average film thickness at which a film may be physically continuous may not be the same as the average film thickness at which a film is electrically continuous, and vice versa.

In some embodiments, the molybdenum nitride films deposited according the methods disclosed herein may be physically continuous at an average film thickness below 40 Å, or below 30 Å, or below 20 Å, or below 10 Å, or even between approximately 10 Å to 40 Å. In other words, the molybdenum nitride film may have an average film closure thickness of less than 40 Å, or less than 30 Å, or less than 20 Å, less than 10 Å, or even between approximately 10 Å and 40 Å. The thickness at which a film becomes physically continuous may be determined utilizing low-energy ion scattering (LEIS).

In some embodiments, the molybdenum nitride films of the current disclosure may have an average film thickness from about 20 Å to 250 Å, or about 50 Å to 200 Å, or even about 100 Å to 150 Å. In some embodiments, the molybdenum nitride films of the current disclosure may have an average film thickness greater than about 20 Å, or greater than about 30 Å, or greater than about 40 Å, or greater than about 50 Å, or greater than about 60 Å, or greater than about 100 Å, or greater than about 250 Å, or greater than about 500 Å, or even between approximately 20 Å and 500 Å. In some embodiments, the molybdenum nitride films of the current disclosure may have an average film thickness of less than about 250 Å, or less than about 100 Å, or less than about 50 Å, or less than about 25 Å, or less than about 10 Å, or less than about 5 Å, or even approximately 5 Å and 250 Å.

Figure 4:
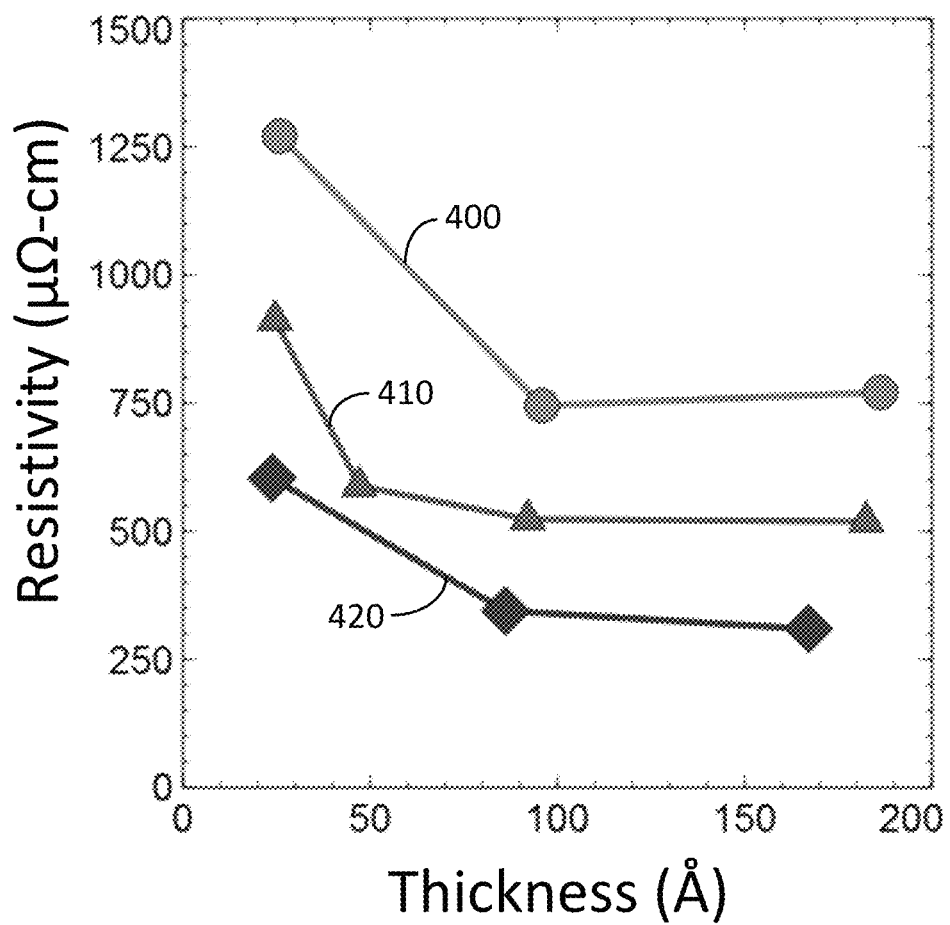
FIG. 4 illustrates the electrical resistivity of a number of molybdenum nitride films at various thicknesses deposited according to the embodiments of the disclosure.

In some embodiments, the molybdenum nitride films deposited according the processes disclosed herein may comprise low electrical resistivity molybdenum nitride films. In more detail, FIG. 4 illustrates the electrical resistivity of a number of molybdenum nitride films at various thicknesses deposited according to the embodiments of the disclosure, wherein the data labelled 400 comprises molybdenum nitride films deposited by the cyclical deposition process 100 (of FIG. 1), the data labelled 410 comprises molybdenum nitride films deposited by the cyclical deposition process 200 (of FIG. 2), and the data labelled 420 comprises molybdenum nitride films deposited by the cyclical deposition process 300 (of FIG. 3). Examination of the electrical resistivity data of FIG. 4 clearly illustrates that the addition of a reducing agent in both process 200 (data labelled 410) and process 300 (data labelled 420) reduces the electrical resistivity of the molybdenum nitride films. In addition, further examination of FIG. 4 clearly illustrates that separately introducing pulses of the nitrogen precursor and the reducing agent (process 300/data labelled 420) further reduces the electrical resistivity of the deposited molybdenum nitride films in comparison to molybdenum nitride films deposited utilizing a co-flow of the nitrogen precursor and the reducing agent (process 200/data labelled 410).

As a non-limiting example, the molybdenum nitride film deposited according to the embodiments of the disclosure may have an electrical resistivity of less than 750 μΩ-cm at an average film thickness of less than 200 Å, or an electrical resistivity of less than 750 μΩ-cm at an average film thickness of less than 100 Å, or an electrical resistivity of less than 1300 μΩ-cm at an average film thickness of less than 25 Å.

As a further non-limiting example, the molybdenum nitride films deposited according to the embodiments of the disclosure may have an electrical resistivity of less than 550 μΩ-cm at an average film thickness of less than 200 Å, or an electrical resistivity of less than 550 μΩ-cm at an average film thickness of less than 100 Å, or an electrical resistivity of less than 950 μΩ-cm at an average film thickness of less than 25 Å.

As a further non-limiting example, the molybdenum nitride films deposited according to the embodiments of the disclosure may have an electrical resistivity of less than 250 μΩ-cm at an average film thickness of less than 200 Å, or an electrical resistivity of less than 250 μΩ-cm at an average film thickness of less than 100 Å, or an electrical resistivity of less than 600 μΩ-cm at an average film thickness of less than 25 Å.

In some embodiments, the molybdenum nitride films deposited according to the embodiments of the disclosure may have an electrical resistivity between 250 μΩ-cm and 1000 μΩ-cm, or between 250 μΩ-cm and 750 μΩ-cm, or even between 250 μΩ-cm and 500 μΩ-cm for molybdenum nitride films with an average film thickness between approximately 10 Å and 200 Å, or between approximately 20 Å and 100 Å, or even between approximately 20 Å and 50 Å.

Figure 5:
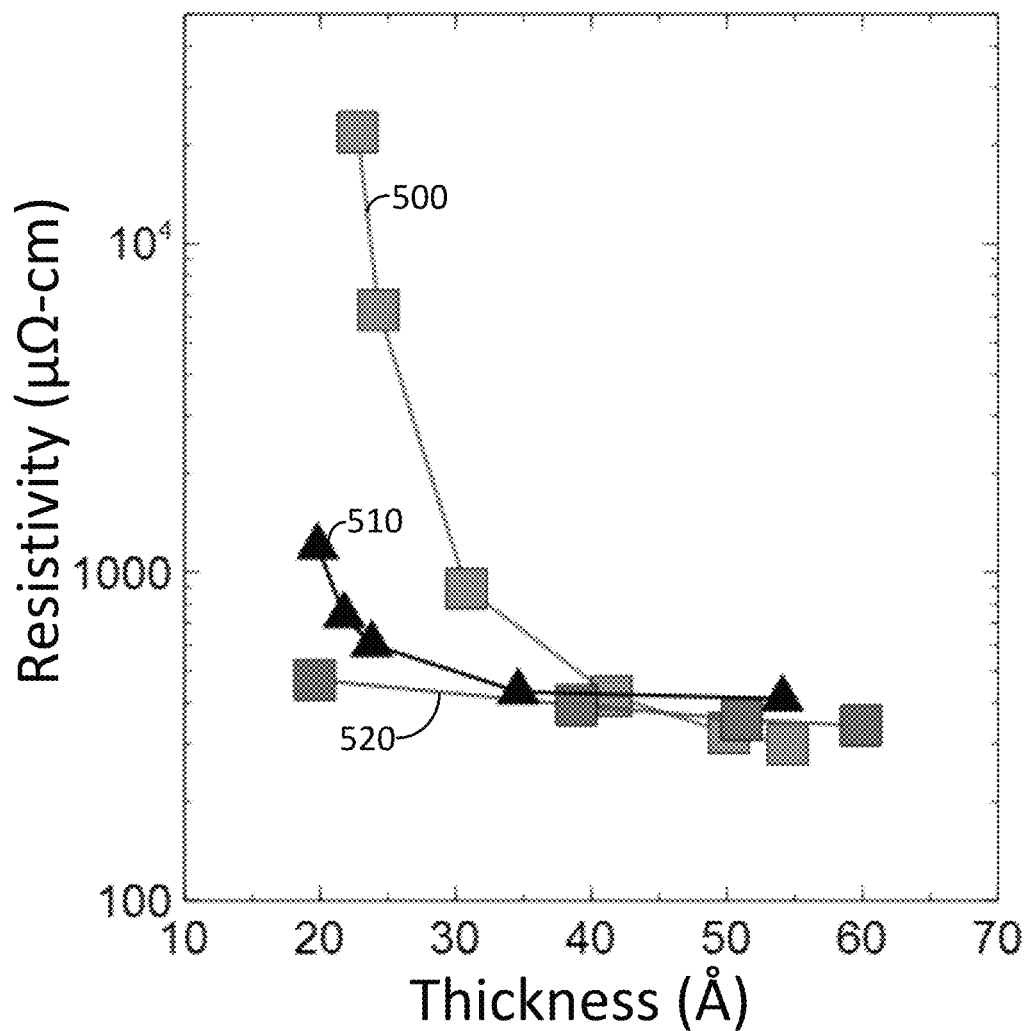
FIG. 5 illustrates the electrical resistivity of a number of molybdenum nitride films at varying thicknesses deposited directly on dielectric compared with the electrical resistivity of titanium nitride films of varying thickness deposited employing a titanium tetrachloride precursor.

The superior electrical resistivity of the molybdenum nitride film deposited by the embodiments of the current disclosure is further demonstrated in FIG. 5 which illustrates the electrical resistivity of a number of molybdenum nitride films at various thicknesses deposited on dielectric substrates according to the embodiments of the disclosure. In addition, FIG. 5 also compares the electrical resistivity molybdenum films of the current disclosure with prior art titanium nitride films of varying thickness deposited utilizing a titanium tetrachloride precursor. The data labelled 500 corresponds to titanium nitride films deposited employing titanium tetrachloride ($TiCl_4$) as the metal precursor. All films illustrated in FIG. 5 are deposited on an exposed surface of a dielectric material.

In more detail, the data labelled 510 corresponds to molybdenum nitride films deposited on a silicon oxide substrate, and the data labelled 520 corresponds to molybdenum nitride films deposited on a hafnium oxide ($HfO_2$) substrate. The exemplary molybdenum nitride films illustrated in FIG. 5 were deposited at a deposition temperature, i.e., substrate temperature, less than approximately 500° C. utilizing molybdenum (IV) dichloride dioxide ($MoO_2Cl_2$) as the molybdenum halide precursor, ammonia ($NH_3$) as the nitrogen precursor, and hydrogen ($H_2$) as the reducing agent.

Examination of the electrical resistivity data in FIG. 5 clearly demonstrates the molybdenum nitride films of the current disclosure have a reduced electrical resistivity at reduced average film thickness when compared with the electrical resistivity of the prior art titanium nitride films of comparable thickness.

As a non-limiting example, the molybdenum nitride films of the current disclosure may have an electrical resistivity of less than 250 μΩ-cm at an average film thickness of less than 50 Å, or an electrical resistivity of less than 300 μΩ-cm at an average film thickness of less than 40 Å, or an electrical resistivity of less than 400 μΩ-cm at an average film thickness of less than 25 Å. In some embodiments, the molybdenum nitride films of the current disclosure may have an electrical resistivity between approximately 250 μΩ-cm and 400 μΩ-cm at an average film thickness of less than 50 Å.

In some embodiments, the molybdenum nitride films deposited according to the embodiments disclosed herein may comprise a crystalline film or an amorphous film. In particular embodiments wherein the molybdenum nitride films are crystalline, the molybdenum nitride films may comprise a MoN phase, or a $Mo_2N$ phase. In some embodiments, the molybdenum nitride films may comprise both a MoN phase and a $Mo_2N$ phase.

Figure 6:
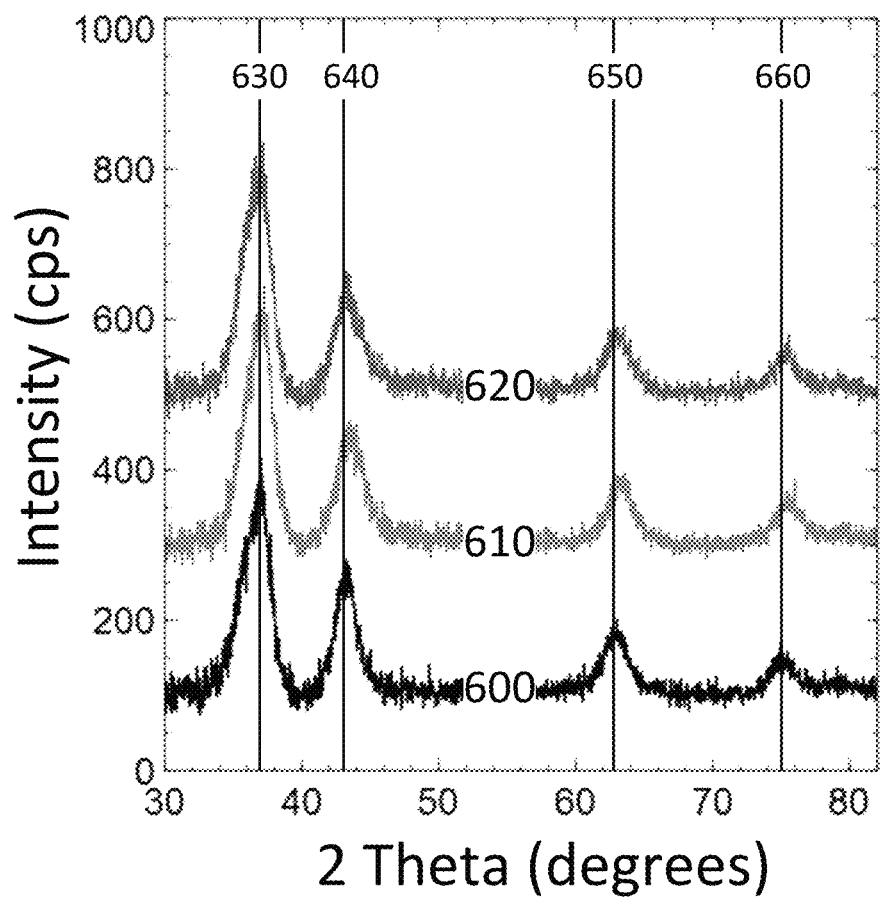
FIG. 6 illustrates x-ray diffraction (XRD) data obtained from exemplary molybdenum nitride films deposited according to the embodiments of the disclosure.

In more detail, FIG. 6 illustrates x-ray diffraction (XRD) data obtained from exemplary molybdenum nitride films deposited according to the embodiments of the disclosure, wherein the XRD data labelled 600 comprises a molybdenum nitride film deposited by the cyclical deposition process 100 (of FIG. 1), the XRD data labelled 610 comprises a molybdenum nitride film deposited by the cyclical deposition process 200 (of FIG. 2), and the XRD data labelled 620 comprises a molybdenum nitride film deposited by the cyclical deposition process 300 (of FIG. 3). Examination of the XRD data of FIG. 6 illustrates that there is not a significant difference between the XRD data for molybdenum nitride films deposited by the processes 100, 200, or 300. However, further examination of the XRD data of FIG. 6 illustrates four dominant peaks in the XRD data labelled as 630, 640, 650, and 660. The XRD peak labelled as 630 corresponds to a MoN phase with a (200) crystallographic orientation and a $Mo_2N$ phase (200) with a (111) crystallographic orientation. The XRD peak labelled as 640 corresponds to a $Mo_2N$ phase with a (200) crystallographic orientation. The XRD peak labelled as 650 corresponds to a MoN phase with a (220) crystallographic orientation and a $Mo_2N$ phase with a (200) crystallographic orientation. The XRD peak labelled as 660 corresponds to a MoN phase with (222) crystallographic orientation and a $Mo_2N$ phase with a (311) crystallographic orientation.

In embodiments wherein the composition of the deposited molybdenum nitride films comprises at least a MoN phase and a $Mo_2N$ phase, the ratio of the MoN phase present within the molybdenum nitride film in comparison to the $Mo_2N$ phase present within the molybdenum nitride film (MoN:$Mo_2N$) may be controlled during the cyclical deposition processes of the current disclosure. For example, the MoN:$Mo_2N$ ratio may be varied by changing the cyclical deposition parameters for the molybdenum nitride deposition, including, but not limited to, deposition temperature, reaction chamber pressure, precursor concentration, or addition of further gas species.

In some embodiments, the MoN phase of the molybdenum nitride may be preferred over the $Mo_2N$ phase of the molybdenum nitride, i.e, an increase in the MoN:$Mo_2N$ ratio. As a non-limiting example, the MoN phase may be preferably deposited relative to the Mo$_2$N phase by the addition of a reducing agent into the deposition process.

The exemplary cyclical deposition methods disclosed herein may also deposit molybdenum nitride films with improved average r.m.s. surface roughness. For example, in some embodiments, the molybdenum nitride films may have an average r.m.s. surface roughness (Ra) (as-deposited) of less than 0.30 nanometers, or less than 0.25 nanometers, or less than 0.20 nanometers, or less than 0.10 nanometers, or even between 0.10 nanometers and 0.30 nanometers. The average r.m.s. surface roughness (Ra) of the as-deposited molybdenum nitride films may be determined employing atomic force microscopy (AFM), e.g., by a scanning a surface area of approximately 100 μm×100 μm.

In some embodiments, the surface roughness of a molybdenum nitride film may be expressed as a percentage roughness of the average total thickness of the molybdenum nitride film. For example, the percentage surface roughness of the molybdenum nitride films of the current disclosure may be less than 10%, or less than 5%, or less 3%, or less than 2%, or less than 1.5%, or even less than 1%. As a non-limiting example, a molybdenum nitride film deposited according to the embodiments of the disclosure may have an average film thickness of approximately 100 Å, wherein the molybdenum nitride film has a r.m.s. surface roughness (Ra) of less than 4 Å and a corresponding percentage surface roughness of less than 4%.

In some embodiments, the substrate may comprise at least one of a dielectric surface, a semiconductor surface, or a metallic surface. As used herein, the term "dielectric surface" may refer to a surface of a dielectric material, including, but not limited to, silicon containing dielectric materials, such as, for example, silicon oxides, silicon nitrides, silicon oxynitrides, silicon oxycarbides, and mixtures thereof, as well as metal oxides, for example. As used herein, the term "metallic surface" may refer to surfaces including a metallic component, including, but not limited to, metal surfaces, metal oxide surfaces, metal silicide surfaces, metal nitride surfaces, and metal carbide surfaces. In some embodiments, the substrate may comprise both dielectric surfaces and metallic surfaces and the cyclical deposition processes of the current disclosure may be utilized to deposit a molybdenum nitride film directly over both the dielectric surfaces and the metallic surfaces, i.e., without the use of an intervening nucleation layer.

The molybdenum nitride films deposited according to the embodiments of the current disclosure may be utilized in variety of applications. For example, the molybdenum nitride films may be utilized as a barrier layer material to prevent diffusion of metallic species into an interlayer dielectric, or as a liner material, or as a portion of a gate stack formed on a semiconductor device structure.

Figure 7:
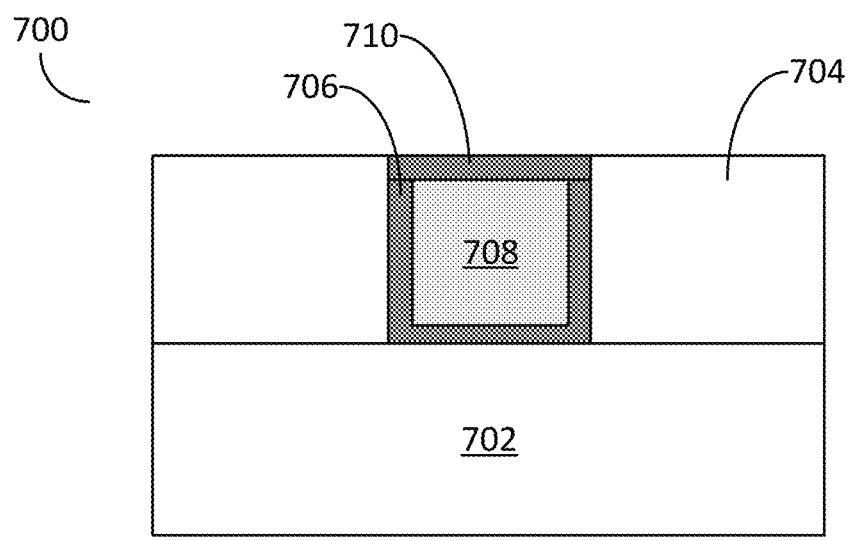
FIG. 7 illustrates a cross-sectional schematic diagram of an exemplary semiconductor device structure including a molybdenum nitride film deposited according to the embodiments of the disclosure.

As a non-limiting example embodiment, a molybdenum nitride film deposited according to the embodiments of the disclosure may be utilized as a barrier layer in a back-end-of-line (BEOL) metallization application, as illustrate in FIG. 7. In more detail, FIG. 7 illustrates a partially fabricated semiconductor device structure 700 comprising a substrate 702 which may include partially fabricated and/or fabricated semiconductor device structures such as transistors and memory elements (not shown). The partially fabricated semiconductor device structure 700 may include a dielectric material 704 formed over the substrate 702 which may comprise a low dielectric constant material, i.e., a low-k dielectric, such as a silicon containing dielectric or a metal oxide dielectric. A trench may be formed in the dielectric material 704 and a barrier layer 706 may disposed on the surface of the trench which prevents, or substantially prevents, the diffusion of the metal interconnect material 708 into the surrounding dielectric material 704. In some embodiments of the disclosure, the barrier layer 706 may comprise a molybdenum nitride film deposited by the deposition processes described herein.

The partially fabricated semiconductor structure 700 may also comprise a metal interconnect material 708 for electrically interconnecting a plurality of device structures disposed in/on substrate 702. In some embodiments, the metal interconnect material 708 may comprise copper, or cobalt. In addition, a capping layer 710 may be disposed over the upper surface of the metal interconnect 708. Therefore, with reference to FIG. 7, the semiconductor device structure 700 may also include a capping layer 710 disposed directly on the upper surface of the metal interconnect material 708. The capping layer 710 may be utilized to prevent oxidation of the metal interconnect material 708 and importantly prevent the diffusion of the metal interconnect material 708 into additional dielectric materials formed over the partially fabricated semiconductor structure 700 in subsequent fabrication processes, i.e., for multi-level interconnect structures. In some embodiments, the metal interconnect material 708, the molybdenum nitride barrier layer 706, and the capping layer 710 may collectively form an electrode for the electrical interconnection of a plurality of semiconductor devices disposed in/on the substrate 702. In some embodiments, the capping layer 710 may comprise a molybdenum nitride film deposited according to the embodiments of the current disclosure.

Figure 8:
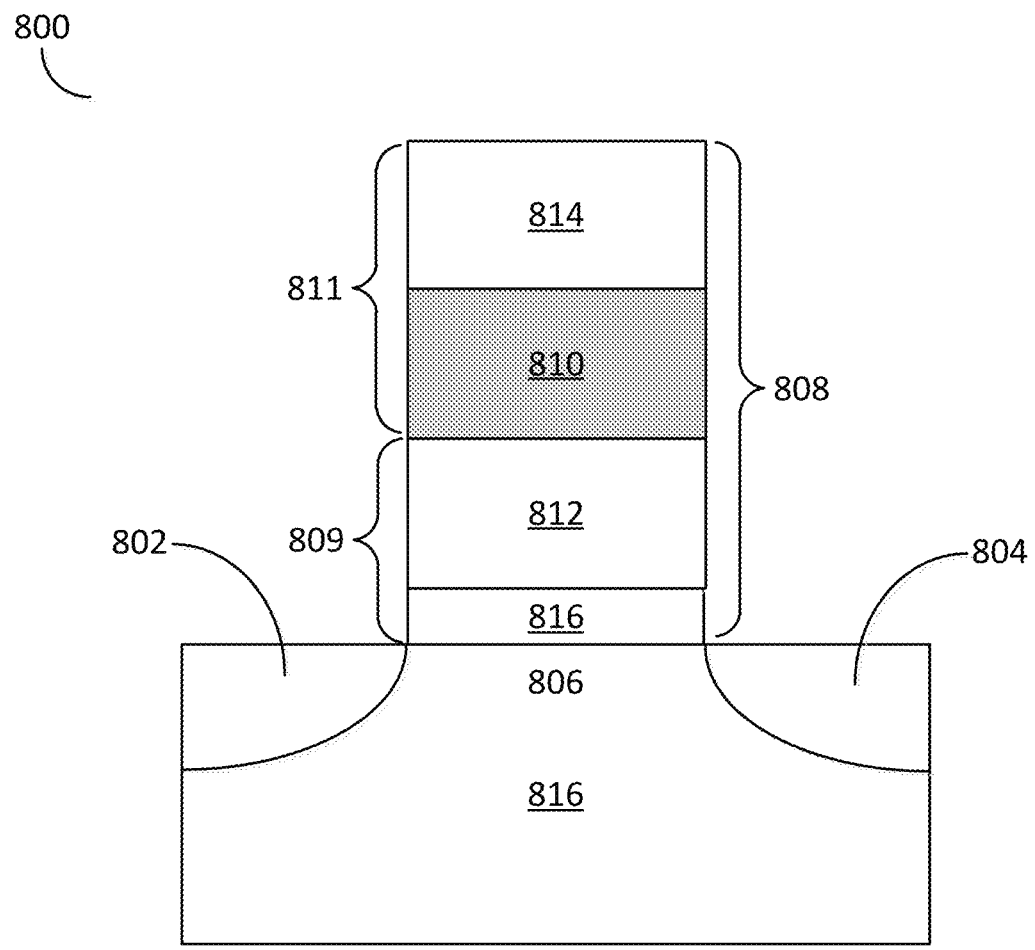
FIG. 8 illustrates a cross-sectional schematic diagram of an additional semiconductor device structures that includes a molybdenum nitride film according to the embodiments of the disclosure.

As a further non-limiting example, the molybdenum nitride films of the current disclosure may comprise at least a portion of a gate electrode in a gate stack formed on a semiconductor channel region. In more detail, FIG. 8 illustrates a cross-sectional schematic diagram of a semiconductor device structure that includes a molybdenum nitride film deposited according to the embodiments of the disclosure. The semiconductor device structure 800 may comprise a transistor structure including a semiconductor body 816 including, a source region 802, a drain region 804, and a semiconductor channel region 806 disposed between the source region 802 and drain region 804.

In some embodiments, the semiconductor device structure 800 may comprise an NMOS device, and both the semiconductor body 816 and the semiconductor channel region 806 may be doped p-type, and both the source region 802 and the drain region 804 may be doped n-type. In alternative embodiments, the semiconductor device structure 800 may comprise a PMOS device, and both the semiconductor body 816 and the semiconductor channel region 806 may be doped n-type, and both the source region 802 and the drain region 804 may be doped p-type. In some embodiments, the semiconductor body 816 may comprise substantially monocrystalline silicon.

Disposed over the semiconductor channel region 806 is a gate stack 808 which may include a gate dielectric 809 and a gate electrode 811. In some embodiments, the gate dielectric may comprise, a silicon oxide interface layer 816 disposed directly on the semiconductor channel region 806, and a high-k dielectric layer 812 disposed directly over the interface layer 816. In some embodiments of the disclosure the high-k dielectric layer 812 may comprise at least one of: hafnium oxide (HfO$_2$), tantalum oxide (Ta$_2$O$_5$), zirconium oxide (ZrO$_2$), titanium oxide (TiO$_2$), hafnium silicate (Hf-SiO$_x$), lanthanum oxide (La$_2$O$_3$), or mixtures/laminates thereof.

Disposed over the gate dielectric 809 and in some embodiments, disposed directly over the gate dielectric 809, is a gate electrode 811 which may comprise a molybdenum nitride film 810 deposited according to the embodiments of the disclosure. Disposed directly over the molybdenum nitride film 810 may be a further metallic film 814 to complete the gate electrode 811, for example, the further metallic film 814 may comprise a transition carbide (e.g., a titanium carbide), or a transition nitride (e.g., a titanium nitride).

In some embodiments of the disclosure, the effective work function of the gate stack 808 disposed over the semiconductor channel region 806 may be modulated by the deposition methods utilized to deposit the molybdenum nitride film 810 and the average film thickness of molybdenum nitride film 810. For example, the effective work function of the gate stack 808 comprising a molybdenum nitride film may range from approximately 4 eV to approximately 5 eV, or greater than 4 eV, or greater 4.5 eV, or greater than 4.75 eV, for an average molybdenum nitride film thickness of less than 50 Å, less than 40 Å, less than 30 Å, or less than 20 Å, or less 15 Å, or between 15 Å and 50 Å.

Therefore, in some embodiments, the molybdenum nitride film comprises a portion of a gate stack formed on a semiconductor channel region, wherein the gate stack has an effective work function of greater than 4.0 eV, or greater than 4.5 eV, or greater than 4.75 eV, or even greater than 4.9 eV, or between 4 eV A and 5 eV, at an average molybdenum nitride film thickness of less than 50 Å, or less than 40 Å, or less than 30 Å, or less than 20 Å, or less than 20 Å, or less than 15 Å, or between 15 Å and 50 Å.

Figure 9:
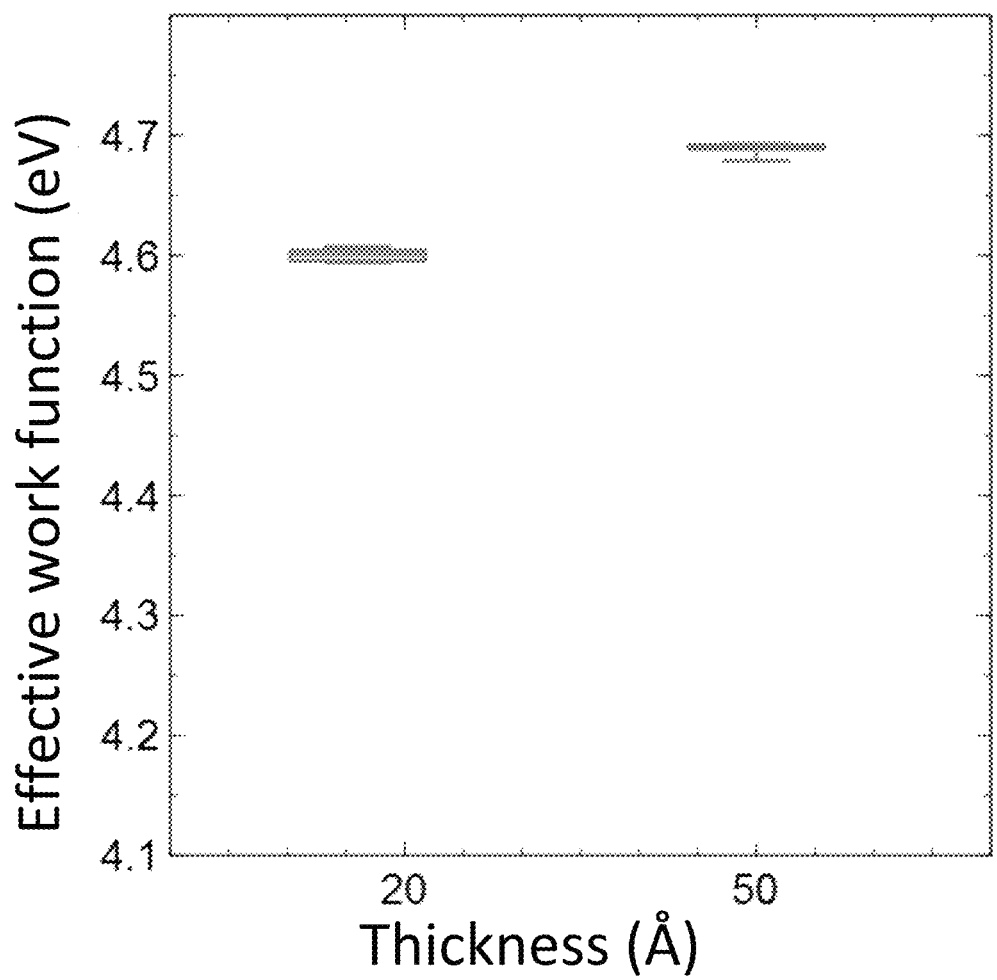
FIG. 9 illustrates the effective work function of a various gate stacks including molybdenum nitride films of various thicknesses deposited according to the embodiments of the disclosure.

As a non-limiting example, FIG. 9 illustrates the effective work function of gate stacks (disposed over a semiconductor channel regions) comprising molybdenum nitride films of various average film thicknesses deposited according to the embodiments of the disclosure. Examination of FIG. 9 demonstrates that as the average film thickness of the molybdenum nitride layer is reduced from approximately 50 Å to 15 Å, the corresponding effective work function of the gate stack including the molybdenum nitride film only slightly decreases from approximately 4.75 eV to approximately 4.6 eV. Therefore in some embodiments of the disclosure, a molybdenum nitride film of the current disclosure may comprise a portion of a gate stack with an effective work function of great than 4 eV, or greater than 4.25 eV, or greater than 4.5 eV, or greater than 4.75 eV, or greater than 4.8 eV, or between 4 eV and 4.8 eV, or between 4.6 eV and 4.75 eV, at an average molybdenum nitride film thickness of less than 50 Å, or less than 40 Å, or less than 30 Å, or less than 20 Å, or less than 15 Å, or between 15 Å and 50 Å. In some embodiments, a gate stack disposed over a semiconductor channel region and comprising a molybdenum nitride film has an effective work function greater than 4.75 eV at an average molybdenum nitride film thickness equal to or less than 50 Å.

Figure 10:
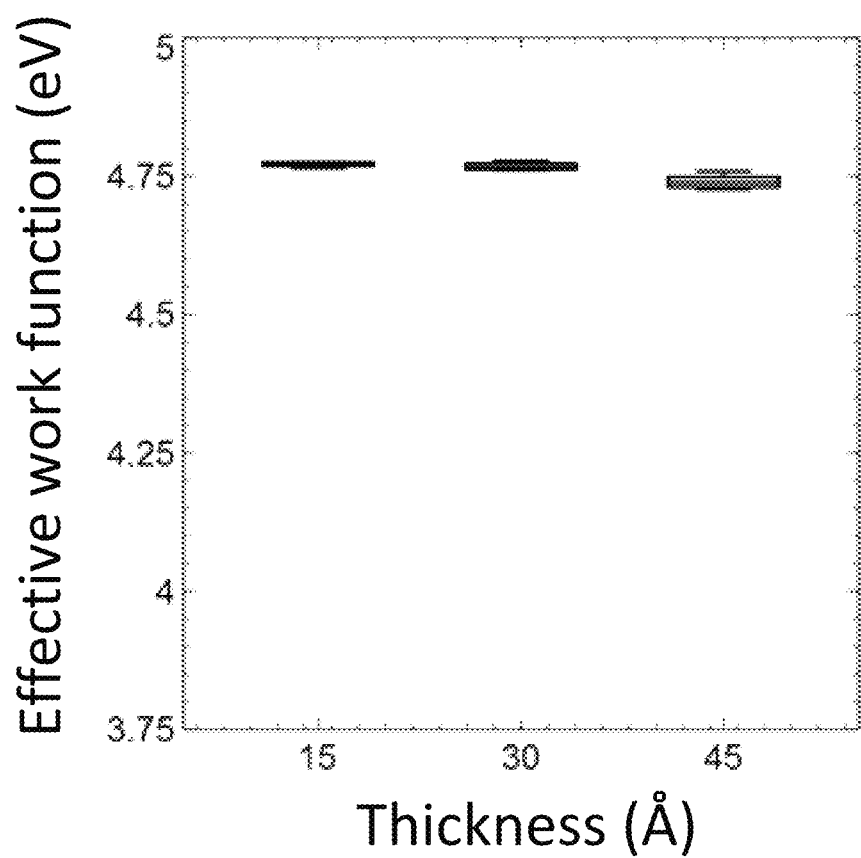
FIG. 10 illustrates the effective work function of further molybdenum nitride films of various thicknesses deposited according to the embodiments of the disclosure.

As a further non-limiting example FIG. 10 illustrates the effective work function of a gate stack comprising molybdenum nitride films of varying average film thicknesses deposited utilizing exemplary cyclical deposition process 300 (FIG. 3). Examination of FIG. 10 demonstrates that as the average film thickness of the molybdenum nitride film is reduced from approximately 45 Å to 15 Å, the corresponding effective work function of a gate stack including the molybdenum nitride film remains substantially unchanged at a value of approximately 4.75 eV. Therefore in some embodiments, a molybdenum nitride film of the current disclosure may comprise a portion of a gate stack with an effective work function of great than 4.6 eV, or greater than 4.75 eV, or greater than 4.8 eV, or greater than 4.9 eV, or greater than 5.0 eV, or between 4.6 eV and 4.9 eV, or even between 4.75 eV and 4.8 eV at an average molybdenum nitride film thickness of less than 50 Å, or less than 40 Å, or less 30 Å, or less than 20 Å, or less than 15 Å, or even between approximately 15 Å and 50 Å.

The ability to form a gate stack comprising a molybdenum nitride film wherein the effective work function of the gate stack is substantially independent of the average film thickness of the molybdenum nitride film may be desirable in some device applications, such as, for PMOS device structures, for example.

Therefore, in some embodiments, a gate stack may comprise a molybdenum nitride film with an average film thickness between approximately 15 Å and 45 Å, wherein the effective work function of the gate stack may have an effective work function substantially independent of the average film thickness of the molybdenum nitride film. In addition, a gate stack comprising a molybdenum nitride film may comprise a substantially constant effective work function of approximately 4.8 eV for an average film thickness between approximately 15 Å and 45 Å. Further, a gate stack may comprise a molybdenum nitride film deposited by a cyclical deposition process comprising: sequentially contacting a substrate with a molybdenum halide precursor, a nitrogen precursor, and a reducing agent, wherein the gate stack comprises a substantially constant effective work function of approximately 4.8 eV for an average molybdenum nitride film thickness between approximately 15 Å and 45 Å.

Figure 11:
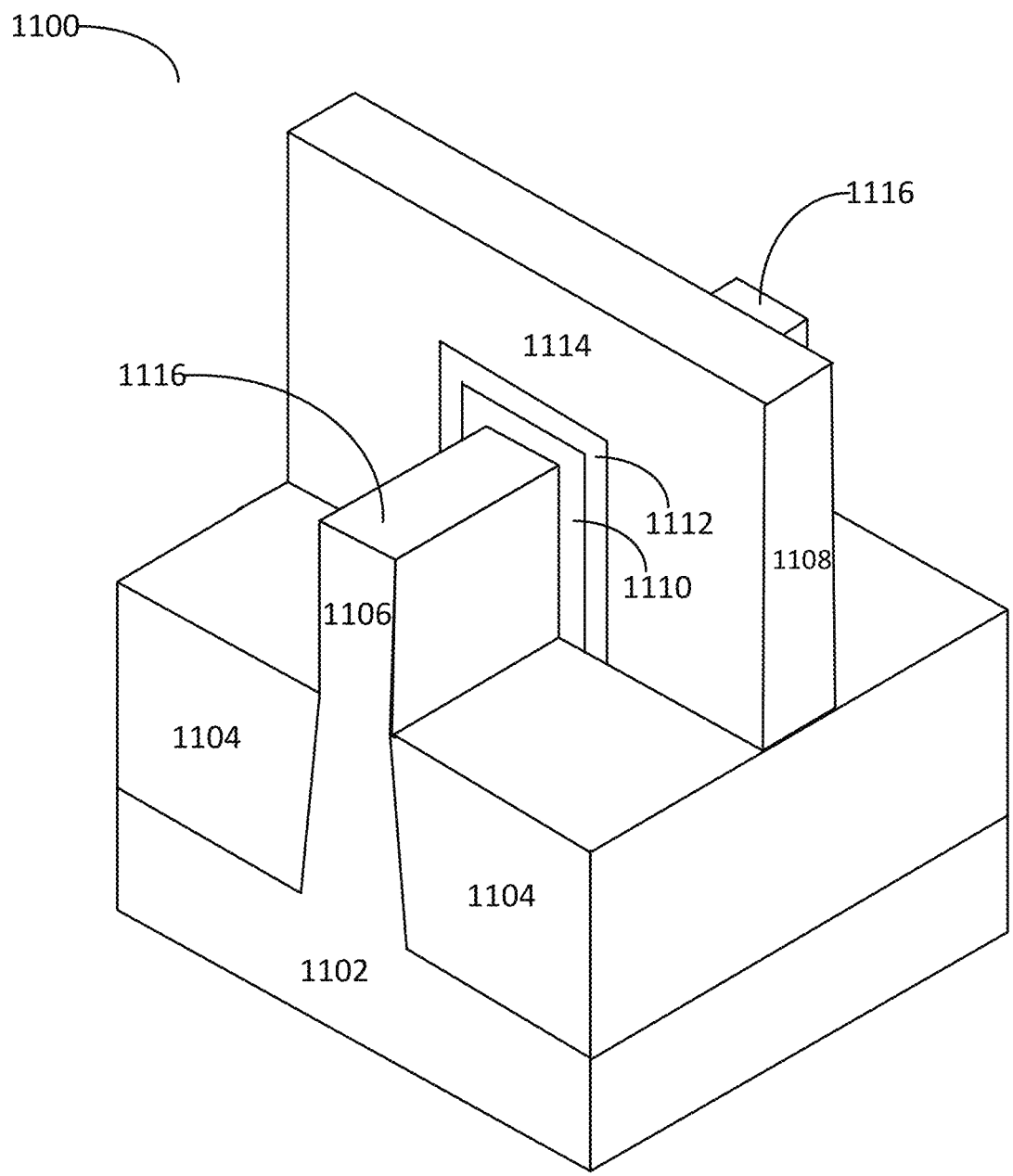
FIG. 11 illustrates a schematic diagram of an exemplary semiconductor device structure that includes a molybdenum nitride film according to the embodiments of the disclosure.

As a further non-limiting application for the molybdenum nitride films of the current disclosure, FIG. 11 illustrates a further cross-sectional schematic diagram of an exemplary semiconductor device structure that includes a molybdenum nitride film deposited according to the embodiments of the disclosure, and in particular illustrates a FinFet semiconductor device structure.

In more detail, FIG. 11 illustrates a non-limiting example of a semiconductor device structure 1100 comprising an exemplary FinFET device structure. The semiconductor device structure 1100 may comprise a substrate 1102, which may comprise a bulk silicon (Si) substrate. The substrate 1102 may be doped with p-type dopants (for NMOS type FinFET devices) and/or with n-type dopants (for PMOS type FinFET devices).

The semiconductor device structure 1100 may also comprise isolation regions 1104, which may comprise shallow trench isolation (STI) regions. The semiconductor device structure 1100 may also comprise a Fin structure 1106 extending over the top surfaces of the isolation regions 1104, the portion of Fin structure 1106 buried beneath the gate stack 1108 comprising the semiconductor channel region. A gate dielectric 1110 may be disposed over the sidewalls of the Fin structure 1106 and the gate dielectric 1110 may comprise a silicon oxide and/or a high-k dielectric material.

A gate electrode may be disposed on the gate dielectric 1110 for providing electrical contact to the semiconductor channel region and the gate electrode may comprise a molybdenum nitride film 1112 deposited according to the embodiments of the current disclosure, as well as an additional metallic film 1114 which may comprise a transition metal carbide, or a transition metal nitride. In some embodiments of the disclosure, the semiconductor device structure 1100 may further comprise source/drain regions 1116 adjacent to the semiconductor channel region.

Figure 12:
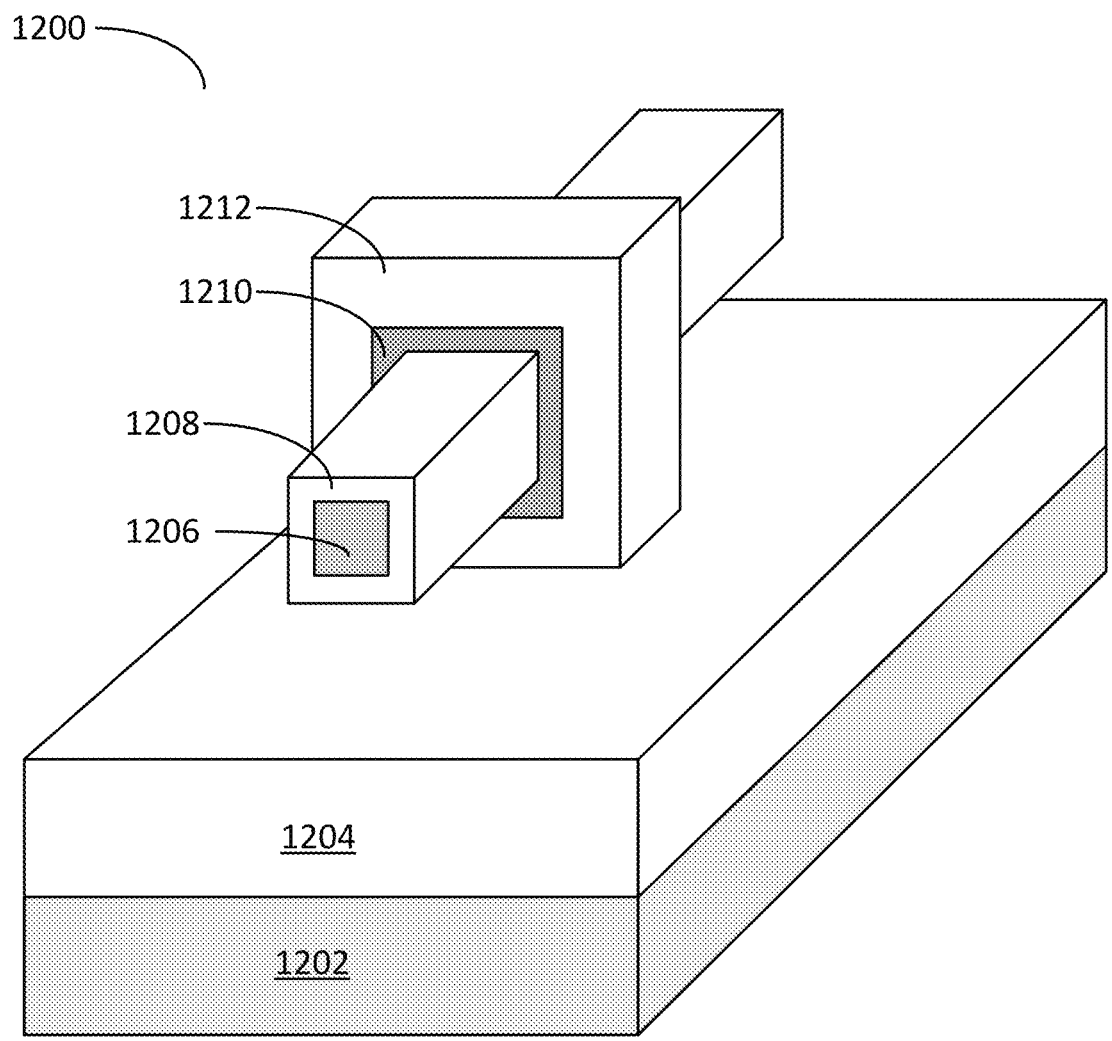
FIG. 12 illustrates a further schematic diagram of an exemplary semiconductor device structure that includes a molybdenum nitride film according to the embodiments of the disclosure.

As a further non-limiting application for the molybdenum nitride films of the current disclosure, FIG. 12 illustrates a further schematic diagram of an exemplary semiconductor device structure that includes a molybdenum nitride film deposited according to the embodiments of the disclosure, and in particular illustrates a gate-all-around (GAA) semiconductor device structure.

In more detail, the semiconductor device structure 1200 may comprise a semiconductor substrate 1202 and a dielectric film 1204 disposed over the substrate 1202. In addition, the GAA device structure may comprise a semiconductor wire 1206 (doped either p-type or n-type) with a gate dielectric 1208 disposed around and surrounding the semiconductor wire 1206. A gate electrode may be disposed around a region of the semiconductor wire 1206 and may comprise a molybdenum nitride film 1210 deposited according to the embodiments of the present disclosure. In addition, the gate electrode may comprise a further metallic film 1212, such as, a transition metal carbide, or transition metal nitride.

The embodiments of the present disclosure also provide semiconductor device structures including a molybdenum nitride film. In some embodiments, a semiconductor device structure may comprise: a semiconductor channel region; and a gate stack disposed directly on the semiconductor channel region, wherein the gate stack comprises: a gate dielectric disposed directly on the semiconductor channel region and a gate electrode comprising a molybdenum nitride film disposed directly on the gate dielectric.

In some embodiments, the semiconductor device structure may comprise a molybdenum nitride film which may have an electrical resistivity of less than 1000 µΩ-cm, or less than 500 µΩ-cm, or less than 250 µΩ-cm, or between 250 µΩ-cm and 1000 µΩ-cm at an average molybdenum nitride film thickness of less than 100 Å, or less than 50 Å, or less than 20 Å, or less than 10 Å, or between 10 Å and 50 Å. In some embodiments, the semiconductor device structure may comprise a molybdenum nitride film which may have an electrical resistivity of less than 250 µΩ-cm at an average film thickness of less than 100 Å. In some embodiments, the semiconductor device structure may comprise a molybdenum nitride film which may have an electrical resistivity of less than 500 µΩ-cm at an average film thickness of less than 25 Å.

In some embodiments, a semiconductor device structure including a molybdenum nitride film may comprise both a MoN phase and a $Mo_2N$ phase. In some embodiments, the semiconductor device structure comprises a physically continuous molybdenum nitride film with an average film thickness of less than 40 Å, or less than 30 Å, or less than 20 Å, or less than 15 Å, or between 15 Å and 40 Å. In some embodiments, a semiconductor device structure may comprise a molybdenum nitride film which may be amorphous, or crystalline.

In some embodiments, the semiconductor device structure including a molybdenum nitride film may comprise a PMOS work function metal device structure, a FinFET semiconductor device structure, or a gate-all-around semiconductor device structure.

Figure 13:
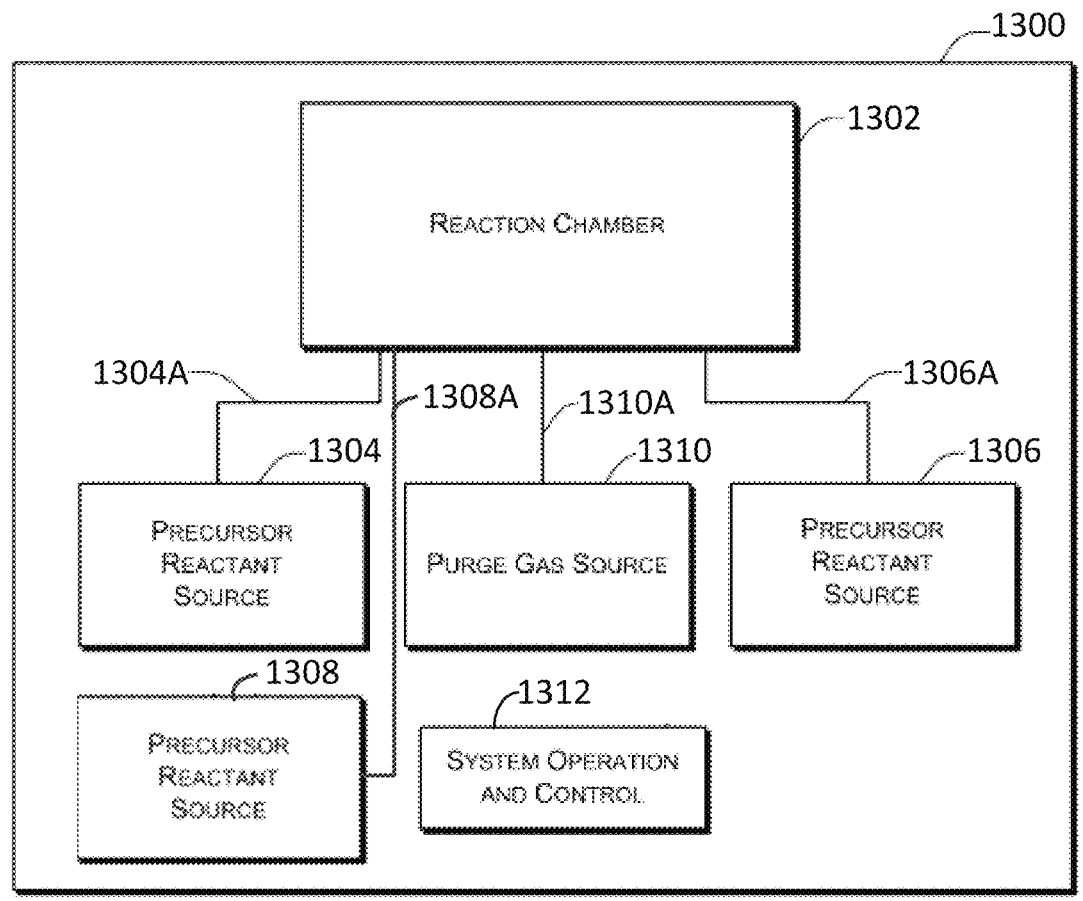
FIG. 13 illustrates a schematic diagram of a reaction system configured for depositing a molybdenum nitride film according to the embodiments of the disclosure.

Embodiments of the disclosure may also include a reaction system configured for depositing the molybdenum nitride films of the present disclosure. In more detail, FIG. 13 schematically illustrates a reaction system 1300 including a reaction chamber 1302 that further includes mechanism for retaining a substrate (not shown) under predetermined pressure, temperature, and ambient conditions, and for selectively exposing the substrate to various gases. A precursor reactant source 1304 may be coupled by conduits or other appropriate means 1304A to the reaction chamber 1302, and may further couple to a manifold, valve control system, mass flow control system, or mechanism to control a gaseous precursor originating from the precursor reactant source 1304. A precursor (not shown) supplied by the precursor reactant source 1304, the reactant (not shown), may be liquid or solid under room temperature and standard atmospheric pressure conditions. Such a precursor may be vaporized within a reactant source vacuum vessel, which may be maintained at or above a vaporizing temperature within a precursor source chamber. In such embodiments, the vaporized precursor may be transported with a carrier gas (e.g., an inactive or inert gas) and then fed into the reaction chamber 1302 through conduit 1304A. In other embodiments, the precursor may be a vapor under standard conditions. In such embodiments, the precursor does not need to be vaporized and may not require a carrier gas. For example, in one embodiment the precursor may be stored in a gas cylinder. The reaction system 1300 may also include additional precursor reactant sources, such as precursor reactant source 1306, and 1308, which may also be coupled to the reaction chamber by conduits 1306A and 1306B as described above. In some embodiments, precursor reactant source 1304 may comprise a molybdenum halide, precursor reactant source 1306 may comprise a nitrogen precursor, and precursor reactant source 1308 may comprise a reducing agent.

A purge gas source 1310 may also be coupled to the reaction chamber 1302 via conduits 1310A, and selectively supplies various inert or noble gases to the reaction chamber 1302 to assist with the removal of precursor gas or waste gases from the reaction chamber. The various inert or noble gases that may be supplied may originate from a solid, liquid or stored gaseous form.

The reaction system 1300 of FIG. 13 may also comprise a system operation and control mechanism 1312 that provides electronic circuitry and mechanical components to selectively operate valves, manifolds, pumps and other equipment included in the reaction system 1300. Such circuitry and components operate to introduce precursors, purge gases from the respective precursor sources 1304, 1306, 1308 and purge gas source 1310. The system operation and control mechanism 1312 also controls timing of gas pulse sequences, temperature of the substrate and reaction chamber, pressure of the reaction chamber, and various other operations necessary to provide proper operation of the reaction system 1300. The operation and control mechanism 1312 can include control software and electrically or pneumatically controlled valves to control flow of precursors, reactants, and purge gases into and out of the reaction chamber 1302. The control system can include modules such as a software or hardware component, e.g., a FPGA or ASIC, which performs certain tasks. A module can advantageously be configured to reside on the addressable storage medium of the control system and be configured to execute one or more processes.

Those of skill in the relevant arts appreciate that other configurations of the present reaction system are possible, including a different number and kind of precursor reactant sources and purge gas sources. Further, such persons will also appreciate that there are many arrangements of valves, conduits, precursor sources, purge gas sources that may be used to accomplish the goal of selectively feeding gases into reaction chamber 1302. Further, as a schematic representation of a reaction system, many components have been omitted for simplicity of illustration, and such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for depositing a molybdenum nitride film on a surface of a substrate, the method comprising:
performing one or more unit deposition cycles of a cyclical deposition process, wherein a unit deposition cycle comprises:
contacting the substrate with a first vapor phase reactant comprising a molybdenum precursor; and
contacting the substrate with a second vapor phase reactant comprising a nitrogen precursor,
wherein the molybdenum nitride film has a percentage roughness of less than 1.5%.

2. The method of claim 1, wherein the nitrogen precursor comprises at least one of: molecular nitrogen ($N_2$), ammonia ($NH_3$), hydrazine ($N_2H_4$), a hydrazine derivative, or a nitrogen-based plasma.

3. The method of claim 1, wherein the molybdenum precursor comprises a molybdenum oxyhalide precursor.

4. The method of claim 1, wherein the molybdenum precursor comprises at least one of: molybdenum pentachloride ($MoCl_5$), molybdenum hexachloride ($MoCl_6$), $Mo(NMe_2)_4$, $Mo(NEt_2)_4$, $Mo_2(NMe_2)_6$, $Mo(tBuN)_2(NMe_2)_2$, $Mo(tBuN)_2(NEt_2)_2$, $Mo(NEtMe)_4$, $Mo(NtBu)_2(StBu)_2$, $Mo(NtBu)_2(iPr_2AMD)_2$ $Mo(thd)_3$, $MoO_2(acac)$, $MoO_2(thd)_2$, $MoO_2(iPr_2AMD)_2$ $Mo(CO)_6$, $Mo(Cp)_2H_2$, $Mo(iPrCp)_2H_2$, $Mo(\eta^6\text{-ethylbenzene})_2$, $MoCp(CO)_2(\eta^3\text{-allyl})$, and $MoCp(CO)_2(NO)$.

5. The method of claim 1, wherein the molybdenum nitride film has an electrical resistivity of less than 750 µΩ-cm at an average molybdenum nitride film thickness of less than 100 Å.

6. The method of claim 1, wherein the molybdenum nitride film is physically continuous at an average film thickness of less than 40 Å.

7. The method of claim 1, wherein the molybdenum nitride film comprises a portion of a gate stack disposed over a semiconductor channel region, wherein the gate stack has an effective work function of greater than 4.6 eV at an average molybdenum nitride film thickness of less than 50 Å.

8. A method for depositing a molybdenum nitride film on a surface of a substrate, the method comprising:
performing one or more unit deposition cycles of a cyclical deposition process, wherein a unit deposition cycle comprises:
contacting the substrate with a first vapor phase reactant comprising a molybdenum precursor; and
contacting the substrate with a second vapor phase reactant comprising a nitrogen precursor,
wherein the molybdenum nitride film has an electrical resistivity of less than 750 µΩ-cm at an average molybdenum nitride film thickness of less than 100 Å.

9. The method of claim 8, wherein the molybdenum nitride film has a percentage roughness of less than 1.5%.

10. The method of claim 8, wherein the nitrogen precursor comprises at least one of: molecular nitrogen ($N_2$), ammonia ($NH_3$), hydrazine ($N_2H_4$), a hydrazine derivative, or a nitrogen-based plasma.

11. The method of claim 8, wherein the molybdenum precursor comprises a molybdenum oxyhalide precursor.

12. The method of claim 8, wherein the molybdenum precursor comprises at least one of: molybdenum pentachloride ($MoCl_5$), molybdenum hexachloride ($MoCl_6$), $Mo(NMe_2)_4$, $Mo(NEt_2)_4$, $Mo_2(NMe_2)_6$, $Mo(tBuN)_2(NMe_2)_2$, $Mo(tBuN)_2(NEt_2)_2$, $Mo(NEtMe)_4$, $Mo(NtBu)_2(StBu)_2$, $Mo(NtBu)_2(iPr_2AMD)_2$ $Mo(thd)_3$, $MoO_2(acac)$, $MoO_2(thd)_2$, $MoO_2(iPr_2AMD)_2$ $Mo(CO)_6$, $Mo(Cp)_2H_2$, $Mo(iPrCp)_2H_2$, $Mo(\eta^6\text{-ethylbenzene})_2$, $MoCp(CO)_2(\eta^3\text{-allyl})$, and $MoCp(CO)_2(NO)$.

13. The method of claim 8, wherein the molybdenum nitride film is physically continuous at an average film thickness of less than 40 Å.

14. The method of claim 8, wherein the molybdenum nitride film comprises a portion of a gate stack disposed over a semiconductor channel region, wherein the gate stack has an effective work function of greater than 4.6 eV at an average molybdenum nitride film thickness of less than 50 Å.

15. A method for depositing a molybdenum nitride film on a surface of a substrate, the method comprising:
performing one or more unit deposition cycles of a cyclical deposition process, wherein a unit deposition cycle comprises:
contacting the substrate with a first vapor phase reactant comprising a molybdenum precursor; and
contacting the substrate with a second vapor phase reactant comprising a nitrogen precursor,
wherein the molybdenum nitride film comprises a portion of a gate stack disposed over a semiconductor channel region, wherein the gate stack has an effective work function greater than 4.6 eV at an average molybdenum nitride film thickness of less than 50 Å.

16. The method of claim 15, wherein the molybdenum nitride film has a percentage roughness of less than 1.5%.

17. The method of claim 15, wherein the nitrogen precursor comprises at least one of: molecular nitrogen ($N_2$), ammonia ($NH_3$), hydrazine ($N_2H_4$), a hydrazine derivative, or a nitrogen-based plasma.

18. The method of claim 15, wherein the molybdenum precursor comprises a molybdenum oxyhalide precursor.

19. The method of claim 15, wherein the molybdenum precursor comprises at least one of: molybdenum pentachloride ($MoCl_5$), molybdenum hexachloride ($MoCl_6$), $Mo(NMe_2)_4$, $Mo(NEt_2)_4$, $Mo_2(NMe_2)_6$, $Mo(tBuN)_2(NMe_2)_2$, $Mo(tBuN)_2(NEt_2)_2$, $Mo(NEtMe)_4$, $Mo(NtBu)_2(StBu)_2$, $Mo(NtBu)_2(iPr_2AMD)_2$ $Mo(thd)_3$, $MoO_2(acac)$, $MoO_2(thd)_2$, $MoO_2(iPr_2AMD)_2$ $Mo(CO)_6$, $Mo(Cp)_2H_2$, $Mo(iPrCp)_2H_2$, $Mo(\eta^6\text{-ethylbenzene})_2$, $MoCp(CO)_2(\eta^3\text{-allyl})$, and $MoCp(CO)_2(NO)$.

20. The method of claim 15, wherein the molybdenum nitride film is physically continuous at an average film thickness of less than 40 Å.

* * * * *